United States Patent
Ji et al.

(10) Patent No.: US 10,980,137 B2
(45) Date of Patent: Apr. 13, 2021

(54) DISPLAY APPARATUS AND PORTABLE TERMINAL

(71) Applicant: Samsung Display Co., Ltd., Yongin-Si (KR)

(72) Inventors: Seonbeom Ji, Seoul (KR); Jonghyun Choi, Seoul (KR); Donghwan Shim, Hwaseong-si (KR); Seungmin Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 16 days.

(21) Appl. No.: 16/352,945

(22) Filed: Mar. 14, 2019

(65) Prior Publication Data

US 2019/0343010 A1 Nov. 7, 2019

(30) Foreign Application Priority Data

May 2, 2018 (KR) ........................ 10-2018-0050881

(51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1626* (2013.01); *H01L 27/3276* (2013.01);
(Continued)

(58) Field of Classification Search
CPC .. H05K 5/0017; H05K 5/0086; G06F 1/1626; H01L 27/3276; H01L 51/0097; H01L 51/5237; H01L 5/0086; H01L 2251/5338
See application file for complete search history.

(56) References Cited

U.S. PATENT DOCUMENTS 8,827,536 B2    9/2014  Lee et al.
9,048,444 B2 *  6/2015  Kim ................... H01L 51/0097
                        (Continued)

FOREIGN PATENT DOCUMENTS

EP    2541371 A2       1/2013
EP    3151084 A1 *     4/2017   ......... H01L 51/0097
                (Continued)

OTHER PUBLICATIONS

European Search Report for European Patent Application No. 19171781.8 dated Oct. 2, 2019.

*Primary Examiner* — Pete T Lee
(74) *Attorney, Agent, or Firm* — Cantor Colburn LLP

(57) ABSTRACT

A display apparatus includes a window member, a display panel and a support member. The window member includes a window flat portion, and a window bent portion which extends bent from the window flat portion. The display panel includes an upper flat portion overlapping with the window flat portion, an upper bent portion extending bent from the upper flat portion to extend along the window bent portion, and a lower bent portion extending from the upper bent portion and bent toward a center of the upper flat portion. The support member disposes the display panel between the window member and the support member and extends along the lower bent portion of the display panel. Each of the upper flat portion and the upper bent portion is a display area of the display panel, and the lower bent portion is a non-display area of the display panel.

19 Claims, 14 Drawing Sheets

(51) Int. Cl.
*H01L 27/32* (2006.01)
*H01L 51/00* (2006.01)
*H01L 51/52* (2006.01)

(52) U.S. Cl.
CPC ...... *H01L 51/0097* (2013.01); *H01L 51/5237* (2013.01); *H05K 5/0086* (2013.01); *H01L 2251/5338* (2013.01)

(56) References Cited

U.S. PATENT DOCUMENTS

| | | |
|---|---|---|
| 9,425,418 B2 | 8/2016 | Kwon et al. |
| 9,490,312 B2 | 11/2016 | Lee et al. |
| 10,224,502 B2 | 3/2019 | Cho et al. |
| 2013/0002133 A1 | 1/2013 | Jin et al. |
| 2013/0002583 A1* | 1/2013 | Jin .................. G06F 3/041 345/173 |
| 2015/0138041 A1* | 5/2015 | Hirakata ............ H01L 27/323 345/1.3 |
| 2015/0331451 A1* | 11/2015 | Shin ................ H04M 1/0277 345/173 |
| 2017/0117501 A1 | 4/2017 | Choi et al. |

FOREIGN PATENT DOCUMENTS

| | | |
|---|---|---|
| EP | 3151084 A1 | 4/2017 |
| KR | 1020170049713 A | 5/2011 |
| KR | 101212172 B1 | 12/2012 |

\* cited by examiner

DISPLAY APPARATUS AND PORTABLE TERMINAL

This application claims priority to Korean Patent Application No. 10-2018-0050881, filed on May 2, 2018, and all the benefits accruing therefrom under 35 U.S.C. § 119, the entire contents of which are hereby incorporated by reference.

BACKGROUND

(1) Field

The present disclosure herein relates to a display apparatus and a portable terminal, and more particularly, to a display apparatus and a portable terminal which have reduced non-display areas.

(2) Description of the Related Art

Portable terminals have been used as a mobile electronic device which a person can easily transport. A portable terminal may include a display panel for displaying an image, and a window member. The window member may determine an outer shape of the portable terminal.

As the designs of electronic display apparatuses such as portable terminals have been diversified, display panels and window members including portions within such portable terminals having curvature have been increasingly demanded. In a display apparatus, an area having curvature may display an image and a non-display area visible to the outside may exist in the area having the curvature.

SUMMARY

The present disclosure may provide a display apparatus and a portable terminal having improved impact resistance at a bent area.

The present disclosure may also provide a display apparatus and a portable terminal reducing or removing visibility of a portion of a non-display area to outside.

In an embodiment, a display apparatus includes a window member, a display panel and a support member. The window member includes a window flat portion, and a window bent portion which extends and bent from the window flat portion.

The display panel includes an upper flat portion overlapping with the window flat portion, an upper bent portion extending and bent from the upper flat portion to extend along the window bent portion, and a lower bent portion extending from the upper bent portion and bent toward a center of the upper flat portion. Each of the upper flat portion and the upper bent portion is a display area of the display panel, and the lower bent portion is a non-display area of the display panel.

The support member disposes the display panel between the window member and the support member. The support member extends along the lower bent portion being the non-display portion of the display panel.

In an embodiment, the upper flat portion may have a shape defining sides of the upper flat portion and a chamfered corner thereof at which two sides of the upper flat portion meet each other. The upper bent portion may extend from at least one side of the upper flat portion.

In an embodiment, the upper bent portion may include an upper chamfer bent portion which extends and is bent outwardly from the chamfered corner of the upper flat portion, and the window bent portion may include an upper window chamfer bent portion which is bent outwardly from the window flat portion to be extended along the upper chamfer bent portion.

In an embodiment, the window member may further include a window extension which extends from the window bent portion and is flat. The display panel may further include an extending flat portion which is disposed between the upper bent portion and the lower bent portion, overlaps with the window extension, and is flat. The extending flat portion may be a portion of the display area of the display panel.

In an embodiment, the upper bent portion may include a first upper bent portion extending from a first side of the upper flat portion, and a second upper bent portion extending from a second side of the upper flat portion. The lower bent portion may include a first lower bent portion extending and bent from the first upper bent portion, and a second lower bent portion extending and bent from the second upper bent portion.

In an embodiment, the support member may include at the first side of the upper flat portion of the display panel, a first support member extended from the first side of the upper flat portion and along each of the upper flat portion, the first upper bent portion and the first lower bent portion, and at the second side of the upper flat portion of the display panel, a second support member extended from the second side of the upper flat portion and along each of the upper flat portion, the second upper bent portion and the second lower bent portion.

In an embodiment, a display apparatus includes a display panel and a support member. The display panel includes an upper flat portion, an upper bent portion and a lower bent portion.

The upper bent portion extends and is bent from the upper flat portion. The lower bent portion extends from the upper bent portion and is bent toward a center of the upper flat portion.

The support member extends along inner surfaces of each of the upper flat portion, the upper bent portion and the lower bent portion, Each of the upper flat portion and the upper bent portion is a display area of the display panel, and the lower bent portion is a non-display area of the display panel.

In an embodiment, a portable terminal includes a window member, a display panel, and a support member.

The window member includes a window flat portion, and a window bent portion which extends and is bent from the window flat portion.

The display panel includes an upper flat portion overlapping with the window flat portion, an upper bent portion which extends and is bent from the upper flat portion to extend along the window bent portion, and a lower bent portion which extends from the upper bent portion and bent toward a center of the upper flat portion.

The support member includes an upper flat support portion extending along the upper flat portion, an upper bent support portion extending and bent from the upper flat support portion to extend along the upper bent portion, and a lower bent support portion extending and bent from the upper bent support portion and to extend along the lower bent portion.

The display panel is disposed between the window member and the support member. Each of the upper flat portion and the upper bent portion is a display area of the display panel, and the lower bent portion is a non-display area of the display panel.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
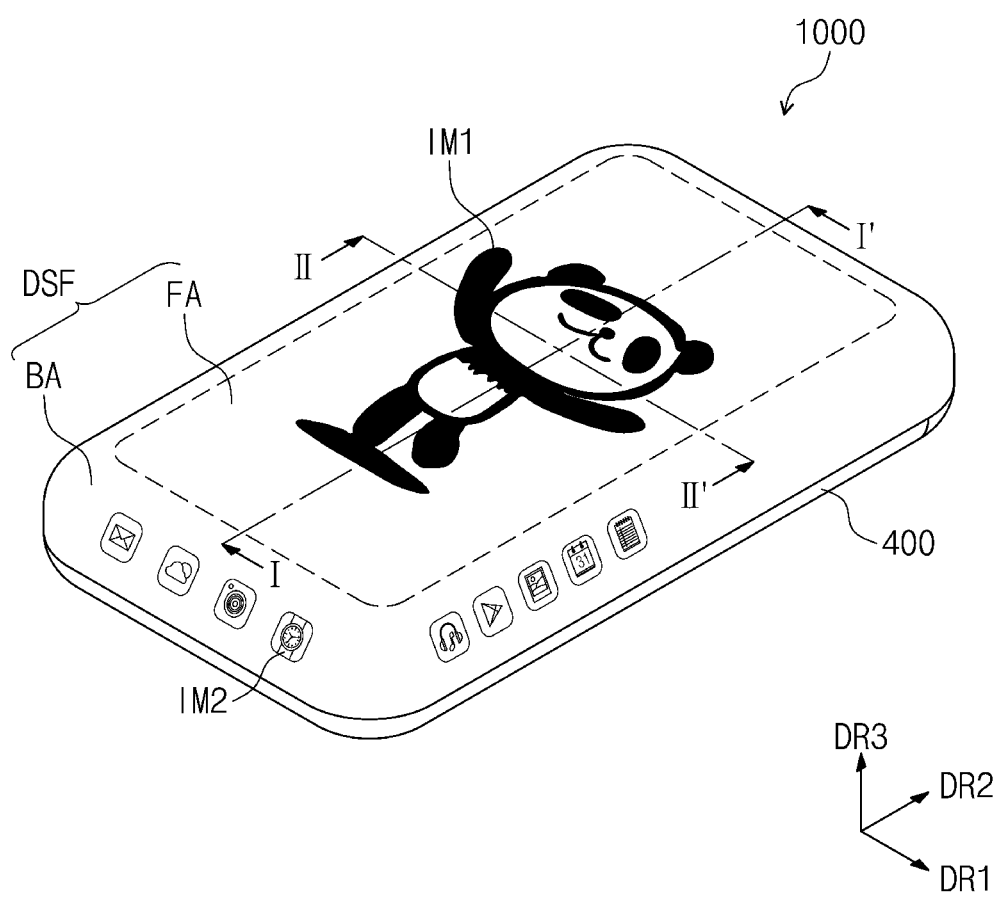
FIG. 1 is a perspective view illustrating an embodiment of a display apparatus according to the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In a display apparatus such as a portable terminal, an area having curvature may display an image and a non-display area visible to the outside may exist in the area having the curvature. However, since the area having curvature may be vulnerable to an external impact, the non-display area which exists in the area having the curvature may also be vulnerable to the external impact.

Figure 2:
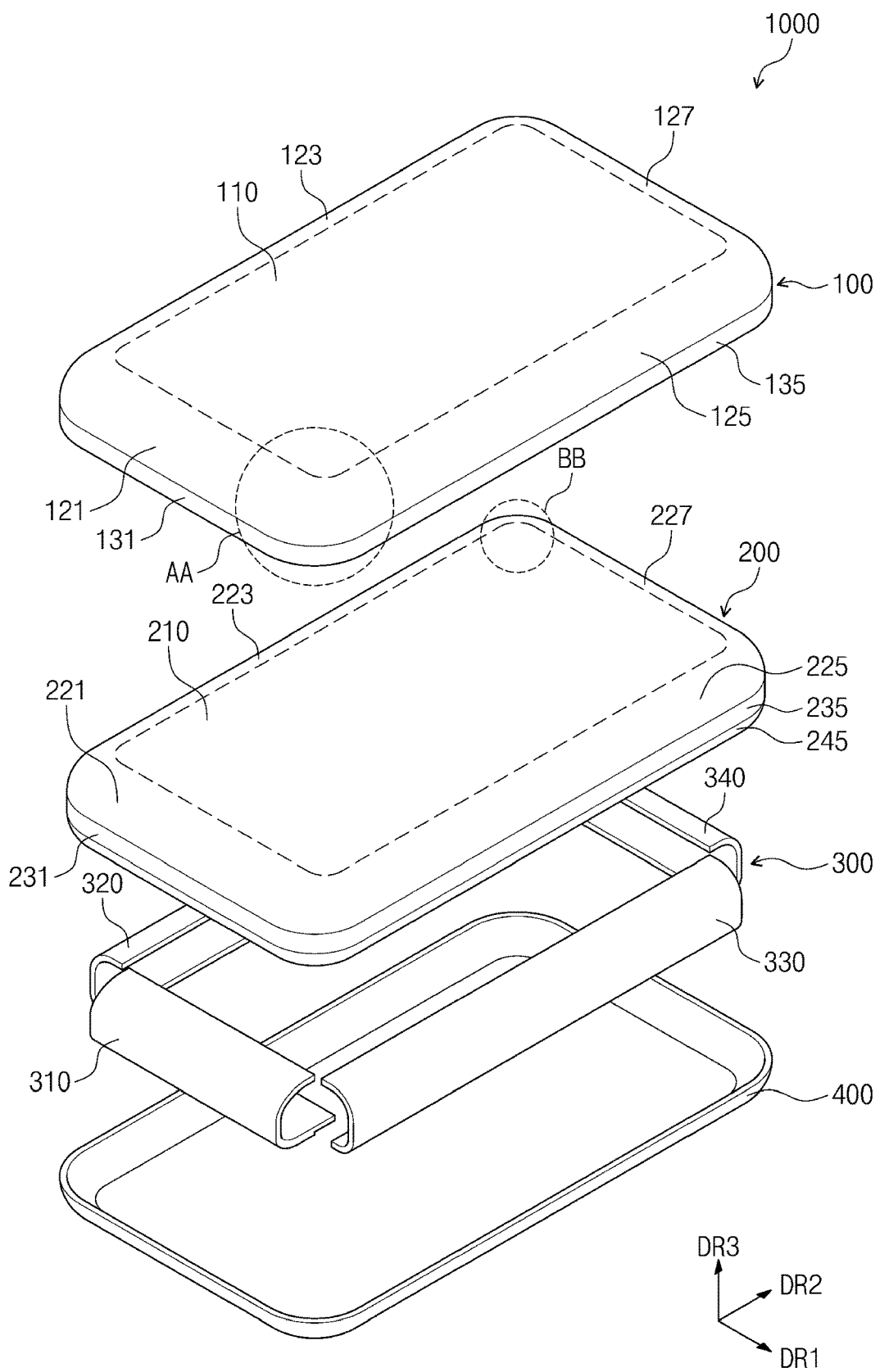
FIG. 2 is an exploded perspective view illustrating the display apparatus of FIG. 1.

FIG. 1 is a perspective view illustrating an embodiment of a display apparatus according to the invention, and FIG. 2 is an exploded perspective view illustrating the display apparatus of FIG. 1.

In FIG. 1, a portable terminal is illustrated as an application example of a display apparatus according to embodiments of the invention. The portable terminal may include a tablet personal computer ("tablet PC"), a smart phone, a personal digital assistant ("PDA"), a portable multimedia player ("PMP"), a game console, or a watch-type electronic apparatus. However, embodiments of the invention are not limited thereto. The display apparatus according to embodiments of the invention may also be applied to relatively large-sized electronic apparatuses (e.g., televisions or external billboards) as well as relatively small and middle-sized electronic apparatuses (e.g., personal computers, notebook computers, car navigation units, or cameras). However, these are provided only as examples of the invention, and the display apparatus according to the invention may also be applied to other electronic display apparatuses without departing the spirit and scope of the invention.

As illustrated in FIG. 1, a display apparatus 1000 may include a plurality of areas defined in a display surface DSF. The display surface DSF may include a flat surface FA and a bent surface BA which is connected to the flat surface FA.

The flat surface FA and the bent surface BA may together define an entirety of the display surface DSF.

The flat surface FA may define sides thereof in a top plan view, such as indicated by the dotted line indicated in FIG. 1. The bent surface BA may extend from one side or multiple sides of the flat surface FA and may have a bent shape.

In cross-section, the bent surface BA may define a curvature at which the bent shape extends from the flat surface FA. A center of curvature of the bent surface BA may be located within the display apparatus 1000 or outside of the display apparatus 1000 such as under the display apparatus 1000 in FIG. 1.

In an embodiment of the invention, the flat surface FA may have a quadrilateral shape (e.g., a rectangular shape) in the top plan view, and the bent surface BA may be connected to each of four sides of the flat surface FA having the quadrilateral shape. However, embodiments of the invention are not limited thereto. In certain embodiments, the bent surface BA may be connected to less than the four sides of the flat surface FA having the quadrilateral shape, such as being connected to at least one side of the flat surface FA.

An image may be displayed at or by both the flat surface FA and the bent surface BA. At least one portion of the bent surface BA may display an image which is continuous with an image displayed on the flat surface FA. Another portion of the bent surface BA different from the at least one portion may not display an image or may display an image which is not continuous with the image displayed on the flat surface FA. However, in an embodiment, the portion of the bent surface BA which does not display an image may be omitted. In embodiments, a continuous image may be displayed by the flat surface FA together with all portions of the bent surface BA.

In FIG. 1, a graphic image of an animal character is illustrated as an example of an image IM1 displayed on the flat surface FA, and an icon as a graphic image is illustrated as an example of an image IM2 displayed on the bent surface BA.

The flat surface FA may be parallel to a plane defined by a first direction DR1 and a second direction DR2 which cross each other, and a normal direction of the flat surface FA may be indicated by a third direction DR3. Such plane and normal direction may also be used as a reference for describing the display apparatus and component members thereof. The third direction DR3 may be a reference direction for distinguishing a front surface and a rear surface of the display apparatus and component members thereof. The third direction DR3 may be a reference direction for distinguishing a thickness of the display apparatus and component members thereof. However, the directions may be relative concepts and may be changed into other directions.

Referring to FIGS. 1 and 2, the display apparatus 1000 may include a window member 100, a display panel 200, a support member 300 and a back case 400. A portion of the back case 400 may be exposed to outside the window member 100, as illustrated in FIG. 1, without being limited thereto.

End portions of each of the window member 100 and the display panel 200 may have a partially bent shape to correspond to the shape of the display surface DSF of FIG. 1. The shapes of the window member 100 and the display panel 200 will be described later in detail with reference to FIGS. 3 and 4.

The window member 100 may be disposed on the display panel 200 in a direction in which an image is displayed, e.g., the third direction DR3.

A top surface of the window member 100 may form or define the display surface DSF described with reference to FIG. 1.

In an embodiment, for example, the window member 100 may include or be formed of glass, sapphire, or plastic. An image may be transmitted through the window member 100 to be viewable from outside the display apparatus 1000.

The display panel 200 may be coupled to a bottom or rear surface of the window member 100, such as by being adhered thereto. The display panel 200 may generate and display an image. In an embodiment, the display panel 200 may be an organic light emitting display panel which uses light to generate and display an image. The display panel 200 may include four side surfaces respectively extending from a portion of the display panel 200 indicated by the dotted line indicated in FIG. 2. The four side surfaces of the display panel 200 may define a bent area of the display panel 200, while the portion indicated by the dotted line in FIG. 2 may define a flat area of the display panel 200.

Even though not shown in the drawings, the display apparatus 1000 may further include a flexible printed circuit board and a printed circuit board. These will be described later in more detail.

Even though not shown in the drawings, the display apparatus 1000 may further include a touch sensing unit (not shown). The touch sensing unit may be disposed between the window member 100 and the display panel 200. However, embodiments of the invention are not limited thereto. In another embodiment, the touch sensing unit may be disposed within the display panel 200 and form a portion of the display panel 200. The touch sensing unit may operate in a resistive type method, a capacitive type method or an electromagnetic induction type method and may obtain information of spatial coordinates of a point at which a touch event occurs to the touch sensing unit.

The support member 300 may be located on a bottom or rear surface of the display panel 200.

The support member 300 may include first to fourth support members 310, 320, 330 and 340. The first to fourth support members 310 to 340 may be disposed to correspond to the four side surfaces of the display panel 200, respectively.

The support member 300 may be disposed to correspond to the bent area of the display panel 200, and thus the support member 300 may support the bent area of the display panel 200 and may improve mechanical strength of the display apparatus 1000 at the bent area. In addition, due to the support member 300 extended along the bent area of the display panel 200, a non-display area of the display panel 200 at such bent area may be disposed at a position not overlapping with the window member 100 (or at a position spaced away from the window member 100), while a display area of the display panel 200 at which an image is displayed, may be disposed at a position overlapping with the window member 100. Thus, visibility of the bent non-display area of the display panel 200 at which an image is not displayed may be reduced in the display apparatus 1000.

The back case 400 may be coupled to the window member 100 to receive the display panel 200 and the support member 300 therebetween. The back case 400 may include a plastic material or a metal material.

Figure 3:
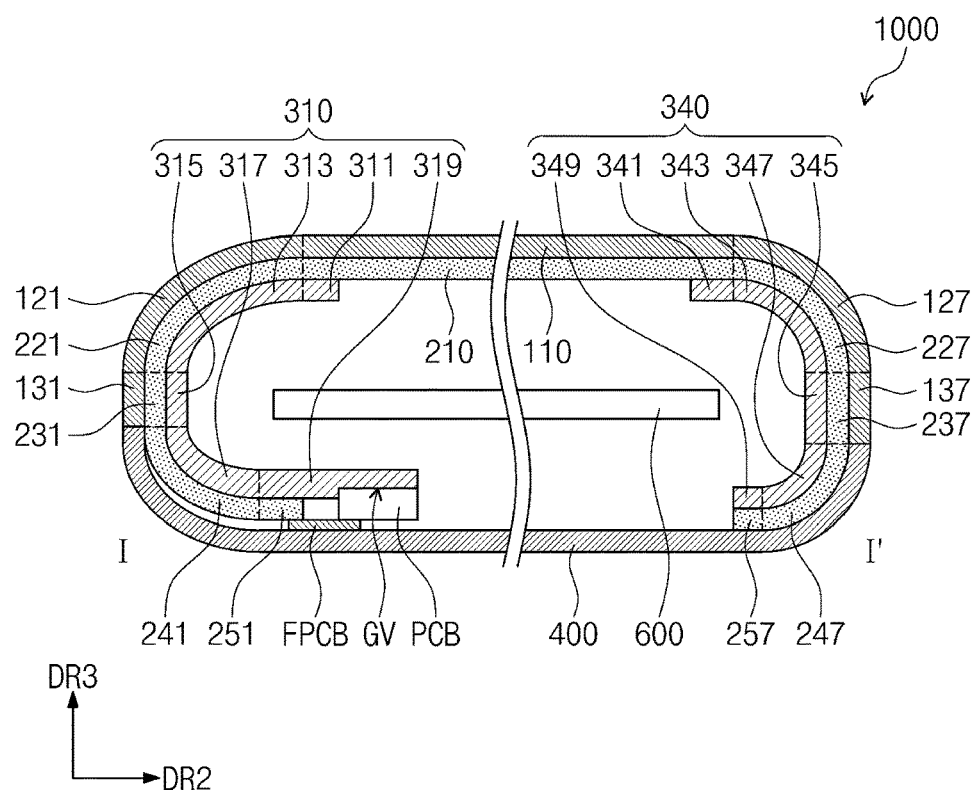
FIG. 3 is a cross-sectional view of the display apparatus taken along a line I-I' of FIG. 1 according to the invention.
Figure 4:
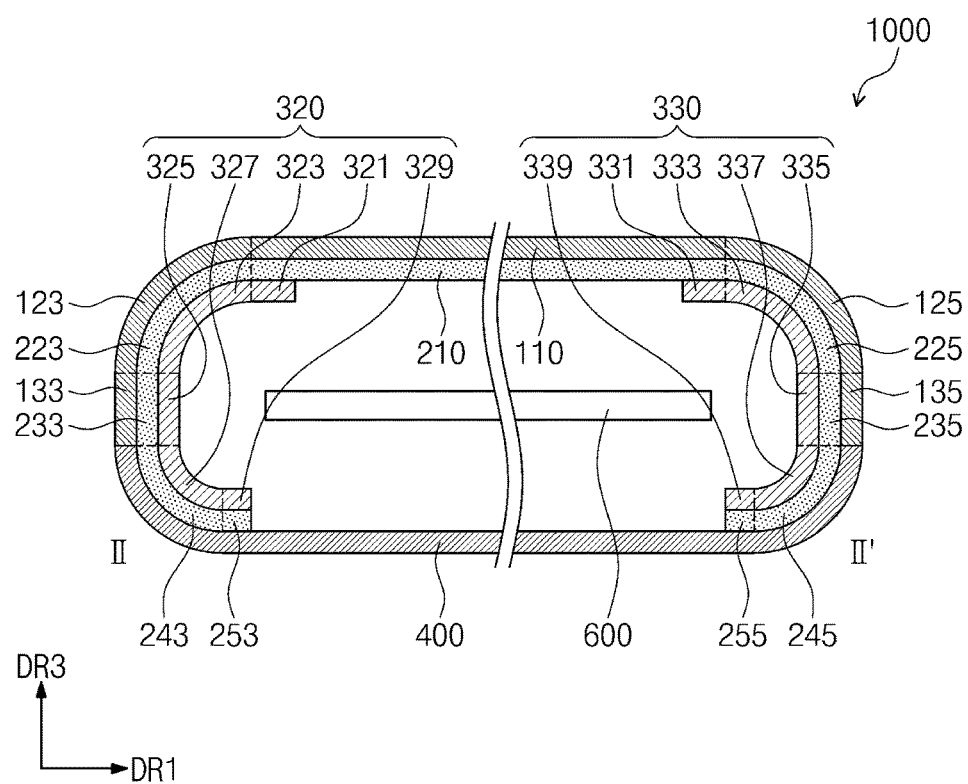
FIG. 4 is a cross-sectional view of the display apparatus taken along a line II-IF of FIG. 1 according to the invention.

FIG. 3 is a cross-sectional view of the display apparatus taken along a line I-I' of FIG. 1 according to the invention, and FIG. 4 is a cross-sectional view of the display apparatus taken along a line II-II' of FIG. 1 according to the invention.

Referring to FIGS. 2 to 4, the window member 100 may include a window flat portion 110, first to fourth window bent portions 121, 123, 125 and 127, and first to fourth window extensions 131, 133, 135 and 137. Each of the first to fourth window bent portions 121, 123, 125 and 127 is bent outwardly from the window flat portion 110 and along a thickness direction of the display apparatus 1000.

The window member 100 may collectively include a plurality of layers arranged along a thickness direction of the window member 100. Each of the window flat portion 110, the first to fourth window bent portions 121, 123, 125 and 127 and the first to fourth window extensions 131, 133, 135 and 137 may include a plurality of layers arranged along a thickness direction of the respective portion or extension.

The window flat portion 110, the first to fourth window bent portions 121, 123, 125 and 127, and the first to fourth window extensions 131, 133, 135 and 137 are not physically separated from each other but are distinguished from each other for the purpose of ease and convenience in description in the embodiment of the invention. That is, one or more element among the window flat portion 110, the first to fourth window bent portions 121, 123, 125 and 127, and the first to fourth window extensions 131, 133, 135 and 137 may extend to define one or more of another element among these portions and extensions.

The window flat portion 110 may be disposed in a plane parallel to the plane defined by the first and second directions DR1 and DR2 and may have a flat shape. In an embodiment of the invention, the window flat portion 110 may have an overall rectangular shape chamfered in such a way that corners of the window flat portion 110 are curved in the top plan view. However, embodiments of the invention are not limited thereto.

The window flat portion 110 may define sides thereof in the top plan view, such as indicated by the dotted line indicated in FIG. 2. The first to fourth window bent portions 121, 123, 125 and 127 may extend from four sides of the window flat portion 110, respectively. The first to fourth window bent portions 121, 123, 125 and 127 may have shapes bent or curved from the corresponding sides of the window flat portion 110, respectively.

The first to fourth window bent portions 121, 123, 125 and 127 may be bent in a downward direction (e.g., along a thickness direction of the display apparatus 1000) from the respective sides of the window flat portion 110 in FIG. 2. In cross-section, the first to fourth window bent portions 121, 123, 125 and 127 may each define a curvature thereof at which the first to fourth window bent portions 121, 123, 125 and 127 extend from the window flat portion 110. Respective centers of curvature of the first to fourth window bent portions 121, 123, 125 and 127 may be located outside the window member 100, such as being under the window member 100 in FIG. 2.

The first to fourth window extensions 131, 133, 135 and 137 may extend from the first to fourth window bent portions 121, 123, 125 and 127, respectively. The first to fourth window extensions 131, 133, 135 and 137 may be flat and may extend parallel to the third direction DR3. In an embodiment, the first and fourth window extensions 131 and 137 may be disposed in a plane parallel to that defined by the first and third directions DR1 and DR3, while the second and third window extensions 133 and 135 may be disposed in a plane parallel to that defined by the second and third directions DR2 and DR3.

Figure 5:
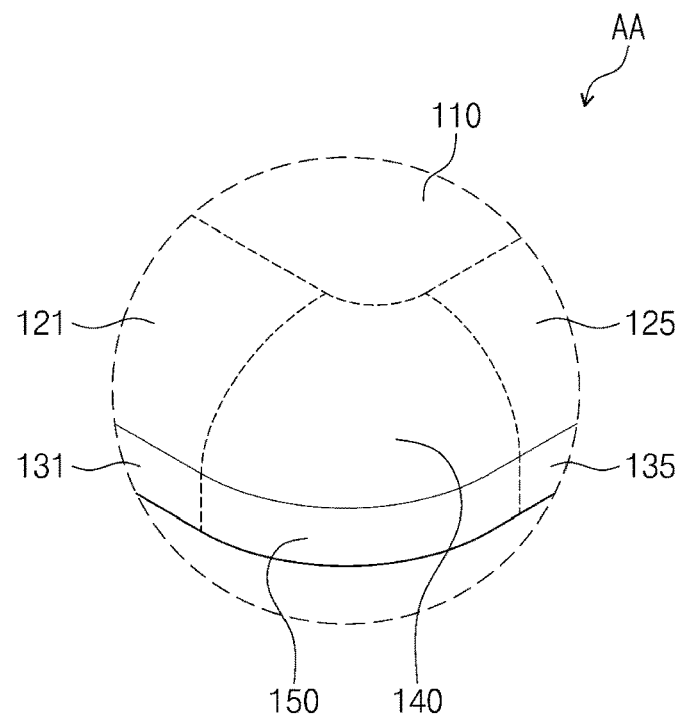
FIG. 5 is an enlarged perspective view of a region 'AA' of FIG. 2.

FIG. 5 is a perspective view of an enlarged region 'AA' of FIG. 2 to illustrate a portion of a window member. The view of FIG. 5 is taken from an outer side of the window member 100.

Referring to FIGS. 2 to 5, in an embodiment of the invention, the window flat portion 110 may have the overall rectangular shape chamfered to have rounded corners in a plan view as described above. Here, a portion of the window member 100 which is connected to the chamfered portion of the window flat portion 110 to be extended therefrom may be defined as being included in the first to fourth window bent portions 121, 123, 125 and 127. The portion of the window member 100 which is connected to the chamfered portion of the window flat portion 110 to be extended therefrom and is included in the first to fourth window bent portions 121, 123, 125 and 127 may be defined as a window chamfer bent portion 140.

Considered in another way, the window chamfer bent portion 140 may be a portion of the window member 100 different from the first to fourth window bent portions 121, 123, 125 and 127 instead of being included therein, such as indicated by the dotted lines in FIG. 5. A window chamfer bent portion 140 may connect two adjacent window bent portions to each other. Here, the two adjacent window portions may respectively lengthwise extend in single directions different from each other, to be connected to each other by the window chamfer bent portion 140.

The window chamfer bent portion 140 may be bent from two sides of the window flat portion 110, which are adjacent to each other. In an embodiment of the invention, four window chamfer bent portions 140 may be provided in the window member 100 to correspond to corners of the display apparatus 1000.

Likewise, a portion of the window member 100 which is connected to the window chamfer bent portion 140 may be defined as being included in the first to fourth window extensions 131, 133, 135 and 137. The portion of the window member 100 which is connected to the window chamfer bent portion 140 and is included in the first to fourth window extensions 131, 133, 135 and 137 may be defined as a window chamfer extension 150. The window chamfer extension 150 may be parallel to the third direction DR3 and may be curved about an axis parallel to the third direction DR3.

Considered in another way, the window chamfer extension 150 may be a portion of the window member 100 different from the first to fourth window extensions 131, 133, 135 and 137 instead of being included therein, such as indicated by the dotted lines in FIG. 5. A window chamfer extension 150 may connect two adjacent window extensions to each other. Here, the two adjacent window extensions may respectively lengthwise extend in single directions different from each other, to be connected to each other by the window chamfer extension 150.

In an embodiment of the invention, four window chamfer extensions 150 may be provided in the window member 100 to correspond to corners of the display apparatus 1000.

Referring again to FIGS. 2 to 4, the display panel 200 may include an upper flat portion 210, first to fourth upper bent portions 221, 223, 225 and 227, first to fourth extending flat portions 231, 233, 235 and 237, first to fourth lower bent portions 241, 243, 245 and 247, and first to fourth lower flat portions 251, 253, 255 and 257.

The upper flat portion 210, the first to fourth upper bent portions 221, 223, 225 and 227, the first to fourth extending flat portions 231, 233, 235 and 237, the first to fourth lower bent portions 241, 243, 245 and 247, and the first to fourth lower flat portions 251, 253, 255 and 257 are not physically separated from each other but are distinguished from each other for the purpose of ease and convenience in description in the embodiment of the invention. That is, one or more element among the upper flat portion 210, the first to fourth upper bent portions 221, 223, 225 and 227, the first to fourth extending flat portions 231, 233, 235 and 237, the first to fourth lower bent portions 241, 243, 245 and 247, and the first to fourth lower flat portions 251, 253, 255 and 257 may extend to define one or more of another element among these portions.

The upper flat portion 210 may be disposed in a plane parallel to the plane defined by the first and second directions DR1 and DR2 and may have a flat shape. The upper flat portion 210 of the display panel 200 may overlap with the window flat portion 110 of the window member 100 along the third direction DR3. In an embodiment of the invention, the upper flat portion 210 may have a shape corresponding to that of the window flat portion 110. In other words, the upper flat portion 210 may have an overall rectangular shape chamfered in such a way that corners of the upper flat portion 210 are curved in the top plan view.

The upper flat portion 210 may define sides thereof in the top plan view, such as indicated by the dotted line indicated in FIG. 2. The first to fourth upper bent portions 221, 223, 225 and 227 may extend from four sides of the upper flat portion 210, respectively. The first to fourth upper bent portions 221, 223, 225 and 227 may have shapes corresponding to those of the first to fourth window bent portions 121, 123, 125 and 127, respectively, and may overlap with the first to fourth window bent portions 121, 123, 125 and 127, respectively. The first to fourth upper bent portions 221, 223, 225 and 227 may have shapes bent or curved from the corresponding sides of the upper flat portion 210, respectively.

The first to fourth upper bent portions 221, 223, 225 and 227 may be bent from respective sides of the upper flat portion 210 in the downward direction (see FIG. 2). In cross-section, the first to fourth upper bent portions 221, 223, 225 and 227 may each define a curvature thereof at which the first to fourth upper bent portions 221, 223, 225 and 227 extend from the upper flat portion 210. Respective centers of curvature of the first to fourth upper bent portions 221, 223, 225 and 227 may be located outside the window member 100, such as being under the first to fourth upper bent portions 221, 223, 225 and 227.

In an embodiment, the centers of curvature of the first to fourth upper bent portions 221, 223, 225 and 227 may be closer to the first to fourth support members 310, 320, 330 and 340 which correspond to the first to fourth upper bent portions 221, 223, 225 and 227 than to the first to fourth upper bent portions 221, 223, 225 and 227.

The first to fourth extending flat portions 231, 233, 235 and 237 may extend from the first to fourth upper bent portions 221, 223, 225 and 227, respectively. The first to fourth extending flat portions 231, 233, 235 and 237 may have shapes corresponding to those of the first to fourth window extensions 131, 133, 135 and 137, respectively, and may laterally (e.g., in the first direction DR1 or the second direction DR2 in FIGS. 3 and 4) overlap with the first to fourth window extensions 131, 133, 135 and 137, respectively. The first to fourth extending flat portions 231, 233, 235 and 237 may be flat and may extend parallel to the third direction DR3. In an embodiment, the first and fourth extending flat portions 231 and 237 may be disposed in a plane parallel to that defined by the first and third directions DR1 and DR3, while the second and third extending flat portions 233 and 235 may be disposed in a plane parallel to that defined by the second and third directions DR2 and DR3

The first to fourth lower bent portions 241, 243, 245 and 247 may extend from the first to fourth extending flat portions 231, 233, 235 and 237, respectively. The first to fourth lower bent portions 241, 243, 245 and 247 may have shapes bent or curved with respect to corresponding sides of the upper flat portion 210, respectively. In an embodiment, for a side of the upper flat portion 210 which lengthwise extends in the first direction DR1, the lower bent portion corresponding to such side is bent or curved about an axis which lengthwise extends in the first direction DR1.

With respect to an end portion of the display apparatus 1000, the first to fourth lower bent portions 241, 243, 245 and 247 may be bent inwardly and along a thickness direction of the display apparatus 1000, in a direction toward a center of the upper flat portion 210 (or a point which is disposed under the upper flat portion 210 and corresponding to a center thereof). Thus, the first to fourth lower bent portions 241, 243, 245 and 247 may not be visible from the front of the display panel 200 in a direction opposite to the third direction DR3. In cross-section, the first to fourth lower bent portions 241, 243, 245 and 247 may each define a curvature thereof at which the first to fourth lower bent portions 241, 243, 245 and 247 extend from the first to fourth extending flat portions 231, 233, 235 and 237. Respective centers of curvature of the first to fourth lower bent portions 241, 243, 245 and 247 may be located above the first to fourth lower bent portions 241, 243, 245 and 247. In an embodiment, the centers of curvature of the first to fourth lower bent portions 241, 243, 245 and 247 may be closer to the first to fourth support members 310, 320, 330 and 340 which correspond to the first to fourth lower bent portions 241, 243, 245 and 247 than to the first to fourth lower bent portions 241, 243, 245 and 247.

The first to fourth lower flat portions 251, 253, 255 and 257 may respectively extend from the first to fourth lower bent portions 241, 243, 245 and 247 toward the center of the upper flat portion 210 in the top plan view. A distal end of the display panel 200 may be defined by first to fourth lower flat portions 251, 253, 255 and 257, particularly the ends of the first to fourth lower flat portions 251, 253, 255 and 257 which are closest to the center of the upper flat portion 210. The first to fourth lower flat portions 251, 253, 255 and 257 may have flat shapes. In an embodiment, the first to fourth lower flat portions 251, 253, 255 and 257 may each be disposed in a plane parallel to that defined by the first and second directions DR1 and DR2.

Figure 6:
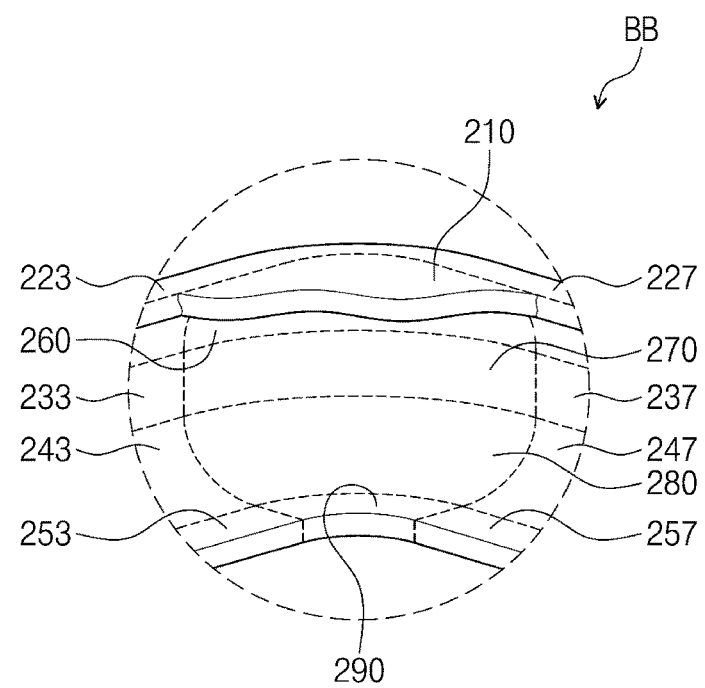
FIG. 6 is an enlarged perspective view of a region 'BB' of FIG. 2.

FIG. 6 is an enlarged perspective view of a region 'BB' of FIG. 2 to illustrate a portion of a display panel. The view of FIG. 6 is taken from an inner side of the display panel 200.

Referring to FIGS. 2 to 4 and 6, in an embodiment of the invention, the upper flat portion 210 may have the overall rectangular shape chamfered to have rounded corners in a plan view as described above. Here, a portion of the display panel 200 which is connected to the chamfered portion of the upper flat portion 210 to be extended therefrom may be defined as being included in the first to fourth upper bent portions 221, 223, 225 and 227. The portion of the display panel 200 which is connected to the chamfered portion of the upper flat portion 210 and is included in the first to fourth upper bent portions 221, 223, 225 and 227 may be defined as an upper chamfer bent portion 260.

Considered in another way, the upper chamfer bent portion 260 may be a portion of the display panel 200 different from the first to fourth upper bent portions 221, 223, 225 and 227 instead of being included therein, such as indicated by the dotted lines in FIG. 6. A upper chamfer bent portion 260 may connect two adjacent upper bent portions to each other. Here, the two adjacent upper bent portions may respectively lengthwise extend in single directions different from each other, to be connected to each other by the upper chamfer bent portion 260.

The upper chamfer bent portion 260 may be bent from two sides of the upper flat portion 210, which are adjacent to each other. In an embodiment of the invention, four upper chamfer bent portions 260 may be provided in the display panel 200 to correspond to corners of the display apparatus 1000.

Likewise, a portion of the display panel 200 which is connected to the upper chamfer bent portion 260 may be defined as being included in the first to fourth extending flat portions 231, 233, 235 and 237. The portion of the display panel 200 which is connected to the upper chamfer bent portion 260 and is included in the first to fourth extending flat portions 231, 233, 235 and 237 may be defined as a panel chamfer extension 270. The panel chamfer extension 270 may be parallel to the third direction DR3 and may be curved about an axis parallel to the third direction DR3.

Considered in another way, the panel chamfer extension 270 may be a portion of the display panel 200 different from the first to fourth extending flat portions 231, 233, 235 and 237 instead of being included therein, such as indicated by the dotted lines in FIG. 6. A panel chamfer extension 270 may connect two adjacent extending flat portions to each other. Here, the two adjacent extending flat portions may respectively lengthwise extend in single directions different from each other, to be connected to each other by the panel chamfer extension 270.

In an embodiment of the invention, four panel chamfer extensions 270 may be provided in the display panel 200 to correspond to corners of the display apparatus 1000.

Likewise, a portion of the display panel 200 which is connected to the panel chamfer extension 270 may be defined as being included in the first to fourth lower bent portions 241, 243, 245 and 247. The portion of the display panel 200 which is connected to the panel chamfer extension 270 and is included in the first to fourth lower bent portions 241, 243, 245 and 247 may be defined as a lower chamfer bent portion 280.

Considered in another way, the lower chamfer bent portion 280 may be a portion of the display panel 200 different from the first to fourth lower bent portions 241, 243, 245 and 247 instead of being included therein, such as indicated by the dotted lines in FIG. 6. A lower chamfer bent portion 280 may connect two adjacent lower bent portions to each other. Here, the two adjacent lower bent portions may respectively lengthwise extend in single directions different from each other, to be connected to each other by the lower chamfer bent portion 280.

The lower chamfer bent portion 280 may be bent with respect to two sides of the upper flat portion 210, which are adjacent to each other. In an embodiment of the invention, four lower chamfer bent portions 280 may be provided in the display panel 200 to correspond to corners of the display apparatus 1000.

Likewise, a portion of the display panel 200 which is connected to the lower chamfer bent portion 280 may be defined as being included in the first to fourth lower flat portions 251, 253, 255 and 257. The portion of the display panel 200 which is connected to the lower chamfer bent portion 280 and is included in the first to fourth lower flat portions 251, 253, 255 and 257 may be defined as a lower chamfer flat portion 290. The lower chamfer flat portion 290 may be flat.

Considered in another way, the lower chamfer flat portion 290 may be a portion of the display panel 200 different from the first to fourth lower flat portions 251, 253, 255 and 257 instead of being included therein, such as indicated by the dotted lines in FIG. 6. A lower chamfer flat portion 290 may connect two adjacent lower flat portions to each other. Here, the two adjacent lower flat portions may respectively lengthwise extend in single directions different from each other, to be connected to each other by the lower chamfer flat portion 290.

Figure 7:
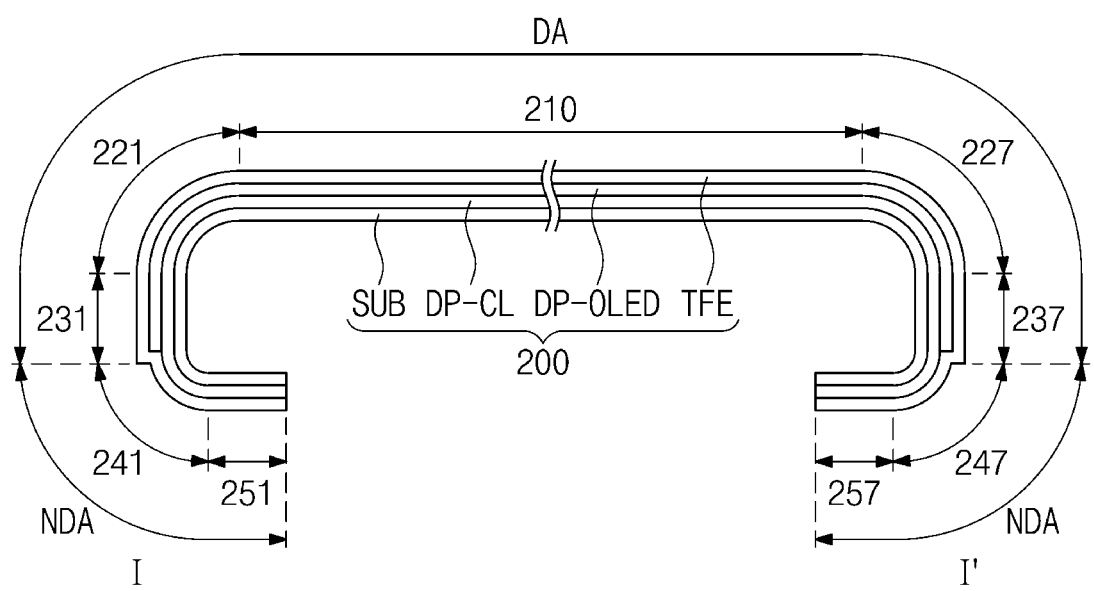
FIG. 7 is a cross-sectional view of an embodiment of a display panel within the display apparatus taken along the line I-I' of FIG. 1 according to the invention.
Figure 7:
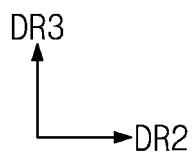

FIG. 7 is a cross-sectional view of an embodiment of a display panel within the display apparatus taken along the line I-I' of FIG. 1 according to the invention.

A display area DA and a non-display area NDA may be defined in the display panel 200. The display area DA may display an image but the non-display area NDA may not display an image.

The upper flat portion 210, the first upper bent portion 221, the fourth upper bent portion 227, the first extending flat portion 231, and the fourth extending flat portion 237 may be defined in the display area DA.

The first lower bent portion 241, the fourth lower bent portion 247, the first lower flat portion 251, and the fourth lower flat portion 257 may be defined in the non-display area NDA.

Even though not shown in the drawings, the second upper bent portion 223, the third upper bent portion 225, the second extending flat portion 233, and the third extending flat portion 235 may also be defined in the display area DA. In addition, the second lower bent portion 243, the third lower bent portion 245, the second lower flat portion 253, and the third lower flat portion 255 may also be defined in the non-display area NDA.

However, embodiments of the invention are not limited thereto. In another embodiment, portions of the first to fourth extending flat portions 231, 233, 235 and 237, which are adjacent to the first to fourth lower bent portions 241, 243, 245 and 247, may be defined in the non-display area NDA.

The display panel 200 may include a base layer SUB, a circuit element layer DP-CL, a display element layer DP-OLED, and an encapsulation layer TFE. The circuit element layer DP-CL, the display element layer DP-OLED, and the encapsulation layer TFE may be disposed on the base layer SUB. Even though not shown in the drawings, the display panel 200 may further include at least one optical functional layer such as a refractive index adjusting layer.

The base layer SUB may include a plastic film. In certain embodiments, the base layer SUB may be a flexible substrate and may include a plastic substrate, a glass substrate, a metal substrate, or an organic/inorganic composite substrate.

The circuit element layer DP-CL may include an intermediate insulating layer and a circuit element. The intermediate insulating layer may include at least one intermediate inorganic layer and at least one intermediate organic layer. The circuit element may include signal lines and a driving circuit with which a pixel of the display panel 200 is driven to display an image.

The display element layer DP-OLED may include an organic light emitting diode. The organic light emitting diode may be disposed in the pixel of the display panel. The display element layer DP-OLED may further include an organic layer such as a pixel defining layer which defines a pixel area of the pixel of the display panel 200, such as where light is emitted or transmitted to display the image. The display element layer DP-OLED may be connected to and/or driven with the signal lines and the driving circuit to display an image. In an embodiment, the organic light emitting diode in the pixel may be driven to generate light with which the image is displayed.

The encapsulation layer TFE may encapsulate the display element layer DP-OLED. The encapsulation layer TFE may include at least one inorganic layer (hereinafter, referred to as 'an encapsulation inorganic layer'). The encapsulation layer TFE may further include at least one organic layer (hereinafter, referred to as 'an encapsulation organic layer'). The encapsulation inorganic layer may protect the display element layer DP-OLED from water and/or oxygen, and the encapsulation organic layer may protect the display element layer DP-OLED from a foreign material such as dust particles. The encapsulation inorganic layer may include a silicon nitride layer, a silicon oxynitride layer, a silicon oxide layer, a titanium oxide layer and/or an aluminum oxide layer. The encapsulation organic layer may include, but not limited to, an acrylic-based organic layer.

Taking FIGS. 3, 4 and 7 together, the support member 300 is disposed along bent areas of the display apparatus 1000, such bent areas including portions of both the window member 100 and the display panel 200. Along a bent direction taken from the upper flat portions, and continuing sequentially along the upper bent, extension/extending flat and lower bent portions, the non-display area NDA of the display panel 200 does not overlap with the window member 100. That is, the display panel 200 and the support member 300 extend further than terminal or distal ends or edges of the window member 100 defined by respective ends of the first to fourth window extensions 131, 133, 135 and 137 to therefore not be visible to outside the display apparatus 1000. In an embodiment, the portions of the display panel 200 which are disposed further than the terminal ends or edges of the window member 100 may be covered by the back case 400 to therefore not be visible to outside the display apparatus 1000. Along such bent direction, the upper bent portions 221, 223, 225 and 227 and the extending flat portions 231, 233, 235 and 237 of the display panel 200, on which images are displayed, may be disposed at positions overlapping with the window member 100 so as to be visible to outside the display apparatus 1000. That is, the display area DA of the display panel 200 may correspond to the window member 100, while the non-display area NDA of the display panel 200 corresponds to portions of the support member 300 which are disposed further than the terminal end of the window member 100.

Figure 8:
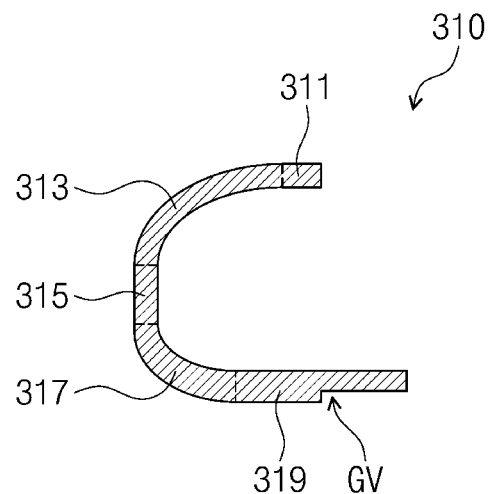
FIG. 8 is an enlarged cross-sectional view illustrating an embodiment of a first support member of a display apparatus according to the invention.
Figure 9:
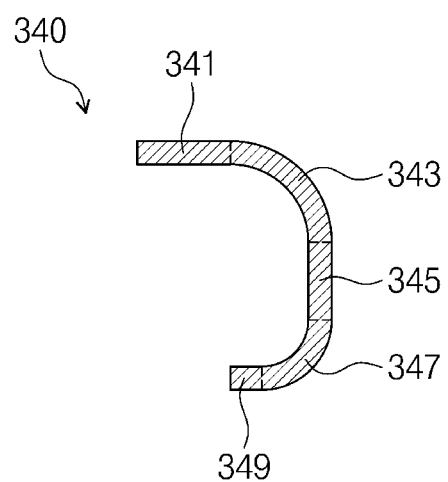
FIG. 9 is an enlarged cross-sectional view illustrating an embodiment of a fourth support member of a display apparatus according to the invention.

FIG. 8 is an enlarged cross-sectional view illustrating an embodiment of a first support member of a display apparatus according to the invention, and FIG. 9 is an enlarged cross-sectional view illustrating an embodiment of a fourth support member of a display apparatus according to the invention.

Referring to FIGS. 2 to 4, 8 and 9, the first to fourth support members 310 to 340 may be coupled to a rear surface of the display panel 200 to support the display panel 200, such as being adhered thereto. Even though not shown in the drawings, a fixing member such as an adhesive may be respectively provided between the display panel 200, and the first to fourth support members 310 to 340, to couple these elements to each other.

In an embodiment of the invention, the first to fourth support members 310 to 340 may be separate elements from each other and spaced apart from each other as illustrated in FIG. 2. Each of the first to fourth support members 310 to 340 may lengthwise extend in a single direction. As shown in FIG. 2, the first and fourth support members 310 and 340 each lengthwise extend in the first direction DR1, while the second and third support members 320 and 330 each lengthwise extend in the second direction DR2.

The first to fourth support members 310 to 340 may include a relatively rigid material. The first to fourth support members 310 to 340 may include a plastic material or a metal material.

The first support member 310 may be coupled to the upper flat portion 210, the first upper bent portion 221, the first extending flat portion 231, the first lower bent portion 241 and the first lower flat portion 251 of the display panel 200 to support these elements within the display apparatus 1000. The first support member 310 may be adhered to one or more of the above-described elements to which the first support member 310 is coupled.

The first support member 310 may include a first upper flat support portion 311, a first upper bent support portion 313, a first extending flat support portion 315, a first lower bent support portion 317, and a first lower flat support portion 319.

The first upper flat support portion 311 may be coupled to such as being adhered to the upper flat portion 210 and may have a shape corresponding to that of a portion of the upper flat portion 210. The first upper flat support portion 311 may be flat.

The first upper bent support portion 313 may be coupled to such as being adhered to the first upper bent portion 221 and may have a shape corresponding to that of the first upper bent portion 221.

The first extending flat support portion 315 may be coupled to such as being adhered to the first extending flat portion 231 and may have a shape corresponding to that of the first extending flat portion 231.

The first lower bent support portion 317 may be coupled to such as being adhered to the first lower bent portion 241 and may have a shape corresponding to that of the first lower bent portion 241.

The first lower flat support portion 319 may be coupled to such as being adhered to the first lower flat portion 251. The first lower flat support portion 319 may be flat. The first lower flat support portion 319 may have a length greater than that of the first lower flat portion 251. That is, for the first support member 310 coupled to the display panel 200, the first lower flat support portion 319 may extend further than a terminal end of the display panel 200 at the first lower flat portion 251. A receiving groove GV may be provided in an area of the first lower flat support portion 319, which does not overlap with the first lower flat portion 251.

A printed circuit board PCB to be described later may be placed in the receiving groove GV of the first lower flat support portion 319.

The first upper flat support portion 311, the first upper bent support portion 313, the first extending flat support portion 315 and the first lower bent support portion 317 may have substantially uniform thicknesses along the first support member 310 in a direction from the first upper flat support portion 311 to the first extending flat support portion 315. A portion of the first lower flat support portion 319 except the portion in which the receiving groove GV is defined or formed may have a thickness substantially equal to that of the first upper flat support portion 311, while another portion in which the receiving groove GV is defined or formed may have a smaller thickness than that of the first upper flat support portion 311. The various thicknesses described above of the portions of the first support member 310 may be uniform across an entirety of the length of the first support member 310, that is, alone the first direction DR1. The above-described thicknesses are taken in a direction normal to an inner surface of the first support member 310 at respective locations along the inner surface.

A shape of a fourth lower flat support portion 349 of the fourth support member 340 may be different from that of the first lower flat support portion 319 of the first support member 310, and other portions of the fourth support member 340 may be similar to corresponding portions of the first support member 310.

The fourth support member 340 may be adhered to the upper flat portion 210, the fourth upper bent portion 227, the fourth extending flat portion 237, the fourth lower bent portion 247 and the fourth lower flat portion 257 of the display panel 200 to support these elements within the display apparatus 1000. The fourth support member 340 may be adhered to one or more of the above-described elements to which the fourth support member 340 is coupled.

The fourth support member 340 may include a fourth upper flat support portion 341, a fourth upper bent support portion 343, a fourth extending flat support portion 345, a fourth lower bent support portion 347, and the fourth lower flat support portion 349.

The fourth upper flat support portion 341, the fourth upper bent support portion 343, the fourth extending flat support portion 345 and the fourth lower bent support portion 347 may have substantially the same shapes as the first upper flat support portion 311, the first upper bent support portion 313, the first extending flat support portion 315 and the first lower bent support portion 347 of the first support member 310, respectively, and thus detailed descriptions thereto are omitted.

The fourth lower flat support portion 349 may be shorter than the first lower flat support portion 319, such that the fourth lower flat support portion 349 does not extend further than a terminal end of the fourth lower flat support portion 257 (e.g., is coplanar with) or extends a smaller distance from the terminal end of the fourth lower flat support portion 257 than the first lower flat support portion 319 extends from the terminal end of the first lower flat portion 251. The receiving groove GV may not be provided in the fourth lower flat support portion 349. That is, the fourth lower flat support portion 349 may have substantially a same thickness as each of the fourth upper flat support portion 341, the fourth upper bent support portion 343, the fourth extending flat support portion 345 and the fourth lower bent support portion 347.

The second support member 320 and the third support member 330 may have substantially the same shape as the fourth support member 340.

The second support member 320 may be coupled to the upper flat portion 210, the second upper bent portion 223, the second extending flat portion 233, the second lower bent portion 243 and the second lower flat portion 253 of the display panel 200 to support these elements within the display apparatus 1000. The second support member 320 may be adhered to one or more of the above-described elements to which the second support member 320 is coupled. The second support member 320 may include a second upper flat support portion 321, a second upper bent support portion 323, a second extending flat support portion 325, a second lower bent support portion 327, and a second lower flat support portion 329.

The third support member 330 may be adhered to the upper flat portion 210, the third upper bent portion 225, the third extending flat portion 235, the third lower bent portion 245 and the third lower flat portion 255 of the display panel 200 to support these elements within the display apparatus 1000. The third support member 330 may include a third upper flat support portion 331, a third upper bent support portion 333, a third extending flat support portion 335, a third lower bent support portion 337, and a third lower flat support portion 339.

Each of the first to fourth upper bent support portions 313, 323, 333 and 343 is respectively bent outwardly from the first to fourth upper flat support portions 311, 321, 331 and 341, and along a thickness direction of the display apparatus 1000. Each of the first to fourth lower bent support portions 317, 327, 337 and 347 is bent inwardly along the thickness direction and toward a point which is located under the upper flat portion 120 and corresponding to a center of the upper flat portion 120.

In an embodiment of the invention, the first to fourth support members 310 to 340 may not overlap with a central area of the upper flat portion 210 of the display panel 200. That is, at an inner area of the display apparatus 1000, the display panel 200 at a portion of the upper flat portion 210 is exposed from the support member 300. However, embodiments of the invention are not limited thereto. In another embodiment, the first to fourth upper flat support portions 311, 321, 331 and 341 of the first to fourth support members 310, 320, 330 and 340 may be connected to each other to completely overlap with the upper flat portion 210 of the display panel 200. Here, an upper flat portion of the support member 300, similar to that of the display panel 200, may extend from the first to fourth upper flat support portions 311, 321, 331 and 341 of the first to fourth support members 310, 320, 330 and 340 for connection thereof to each other.

Referring again to FIG. 3, the display apparatus 1000 may further include a flexible printed circuit board FPCB and the printed circuit board PCB.

The flexible printed circuit board FPCB may electrically connect the display panel 200 to the printed circuit board PCB. The flexible printed circuit board FPCB may be flexible.

In an embodiment of the invention, the flexible printed circuit board FPCB may be coupled to the first lower flat portion 251, such as being adhered thereto.

The printed circuit board PCB may provide control and/or driving signals to the display panel 200 to display an image through the flexible printed circuit board FPCB and/or may receive control and/or driving signals from the display panel 200 through the flexible printed circuit board FPCB. In an embodiment, such signals may be provided to the pixel of the display panel 200 without being limited thereto.

In a direction normal to the first lower flat support portion 319, the printed circuit board PCB may be thicker than the first lower flat portion 251 of the display panel 200 and may be placed in the receiving groove GV provided in the first lower flat support portion 319 of the first support member 310. A thickness of the printed circuit board PCB may be substantially equal to a sum of a thickness of the first lower flat portion 251 and a depth of the receiving groove GV which is also taken in the direction normal to the first lower flat support portion 319.

According to embodiments of the invention, the support member 300 may be disposed to correspond to the bent area of the display panel 200, and thus the support member 300 may support the bent area of the display panel 200 and may improve the mechanical strength of the display apparatus 1000. In addition, due to the support member 300 disposed along bent areas of the display apparatus 1000, the non-display area NDA (see FIG. 7 taken with FIGS. 3 and 4) of the display panel 200 may be disposed at a position which does not overlap with the window member 100, but the upper bent portions 221, 223, 225 and 227 and the extending flat portions 231, 233, 235 and 237 of the display panel 200, on which images are displayed, may be disposed at positions overlapping with the window member 100. As a result, considering the window member 100 allows underlying portions of the display apparatus 1000 to be visible to outside thereof, a portion of the non-display area NDA of the display apparatus 1000, which is visible to the outside, may be reduced or removed since the window member 100 does not overlap such portion of the non-display area NDA. Instead, this portion of the non-display area NDA is covered or blocked by the back case 400.

The display apparatus 1000 may further include an electronic component 600. The electronic component 600 may be disposed in a space which is defined under the display panel 200 and between the first to fourth support members 310 to 340. The electronic component 600 may include components for operating the display apparatus 1000, for example, a battery and/or various sensors.

In an embodiment of the invention, a portion of the display panel 200 may be closer to the back case 400 than the electronic component 600. In an embodiment, for example, when the electronic component 600 is the battery, the first to fourth lower flat portions 251, 253, 255 and 257 of the display panel 200 may be closer to the back case 400 than the electronic component 600. In the display apparatus 1000 according to embodiments of the invention, the display panel 200 may have the shape guided by the support member 300. Thus, the electronic component 600 may be received in the inner space of the support member 300 while reducing a size of the non-display area NDA visible to the outside. As a result, space utilization of the display apparatus 1000 may be improved or maximized.

Figure 10:
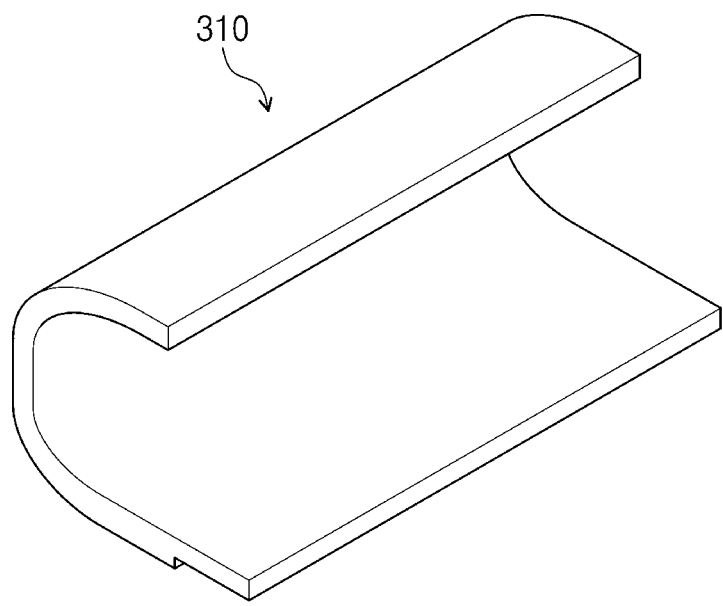
FIG. 10 is a perspective view illustrating an embodiment of a first support member of a display apparatus according to the invention.
Figure 11:
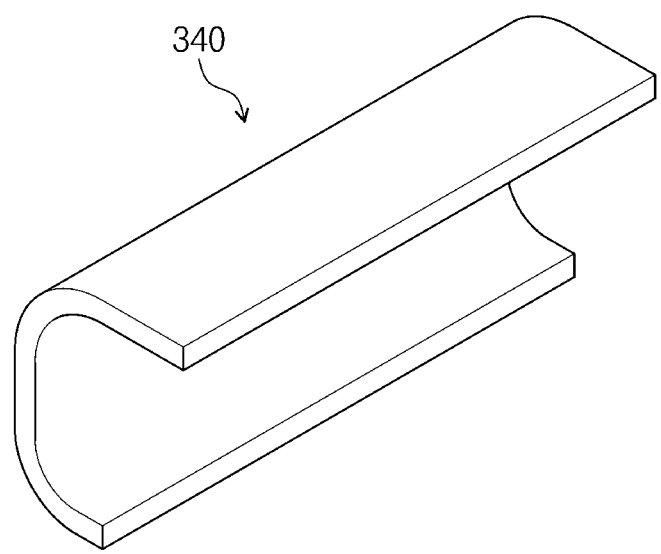
FIG. 11 is a perspective view illustrating an embodiment of a fourth support member according to the invention.

FIG. 10 is a perspective view illustrating an embodiment of a first support member of a display apparatus according to the invention, and FIG. 11 is a perspective view illustrating an embodiment of a fourth support member of a display apparatus according to the invention. Second to fourth support members 320, 330 and 340 may have substantially the same shape, and thus the shape of the fourth support member 340 will be described as a representative example of the shapes of the second to fourth support members 320, 330 and 340.

Referring to FIGS. 10 and 11, each of the first and fourth support members 310 and 340 may be provided in a single body. Each of the first and fourth support members 310 and 340 may have a shape elongated lengthwise along a corresponding side of the upper flat portion 210 of the display panel 200.

Figure 12:
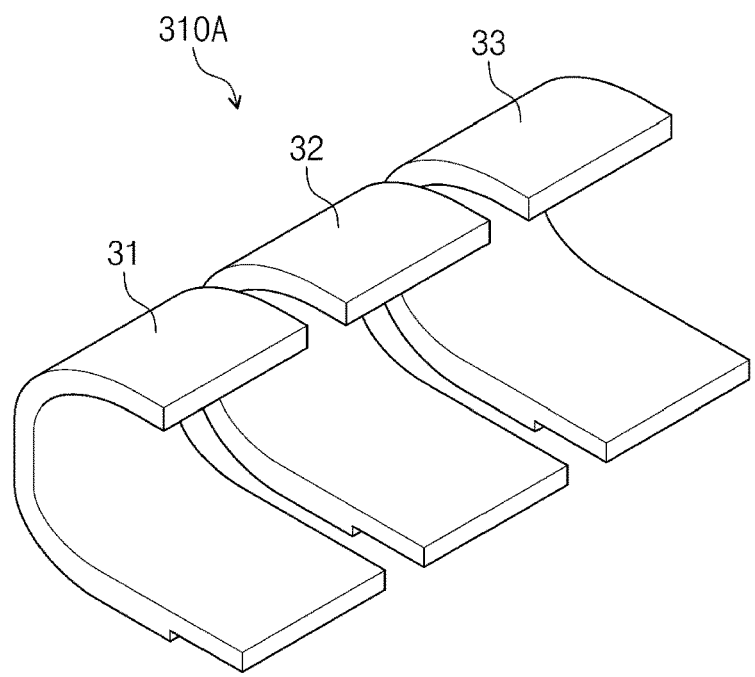
FIG. 12 is a perspective view illustrating another embodiment of a first support member of a display apparatus according to the invention.

FIG. 12 is a perspective view illustrating another embodiment of a first support member of a display apparatus according to the invention.

Referring to FIG. 12, a first support member 310A may include a plurality of sub-support members 31, 32 and 33 spaced apart from each other along a length direction of the first support member 310A. The plurality of sub-support members 31, 32 and 33 may be spaced apart from each other in a length extending direction of a corresponding side of the upper flat portion 210 of the display panel 200. Three sub-support members 31, 32 and 33 are illustrated in FIG. 12. However, embodiments of the invention are not limited thereto. The number of the sub-support members 31, 32 and 33 may be variously set.

In an embodiment, while not explicitly shown, similar to the first support member 310A, one or more of the second to fourth support members 320, 330 and 340 may also be provided as a collection of sub-support members arranged a length extending direction of a corresponding side of the upper flat portion 210 of the display panel 200.

Figure 13:
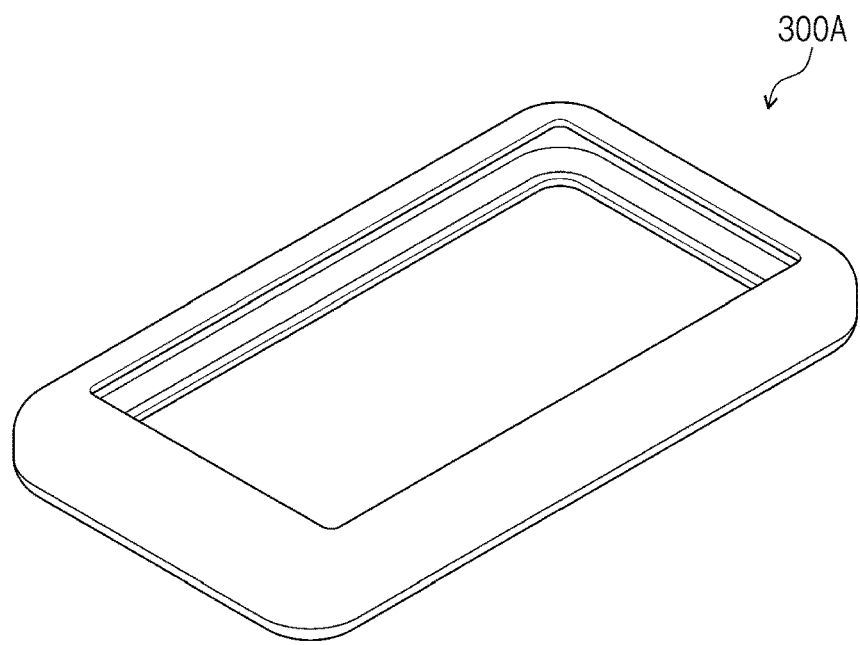
FIG. 13 is a perspective view illustrating another embodiment of a support member according to the invention.

FIG. 13 is a perspective view illustrating another embodiment of a support member of a display apparatus according to the invention.

A support member 300A of FIG. 13 may have a shape in which the first to fourth support members 310 to 340 described with reference to FIGS. 2, 3, 4, 8 and 9 are connected to each other to form a single body. It is shown that the upper flat support portions of the support member 300A are disconnected from each other to form an enclosed opening at which the display panel 200 may be exposed from the support member 300A. However, in an embodiment, the upper flat support portions of the support member 300A may be connected to each other such as by an upper flat portion which overlaps the upper flat portion 210 of the display panel 200.

The support member 300A may have a single unitary body shape. Referring to the chamfer structure of the display panel shown in FIG. 6, the support member 300A may have an upper chamfer bent portion, a panel chamfer extension, a lower chamfer bent portion and a lower chamfer flat portion. The support member 300A may also be correspondingly coupled, such as by being adhered to inner surfaces of the upper chamfer bent portion 260, the panel chamfer extension 270, the lower chamfer bent portion 280 and the lower chamfer flat portion 290 of the display panel 200 described with reference to FIG. 6 and may support these elements within the display apparatus 1000.

Figure 14:
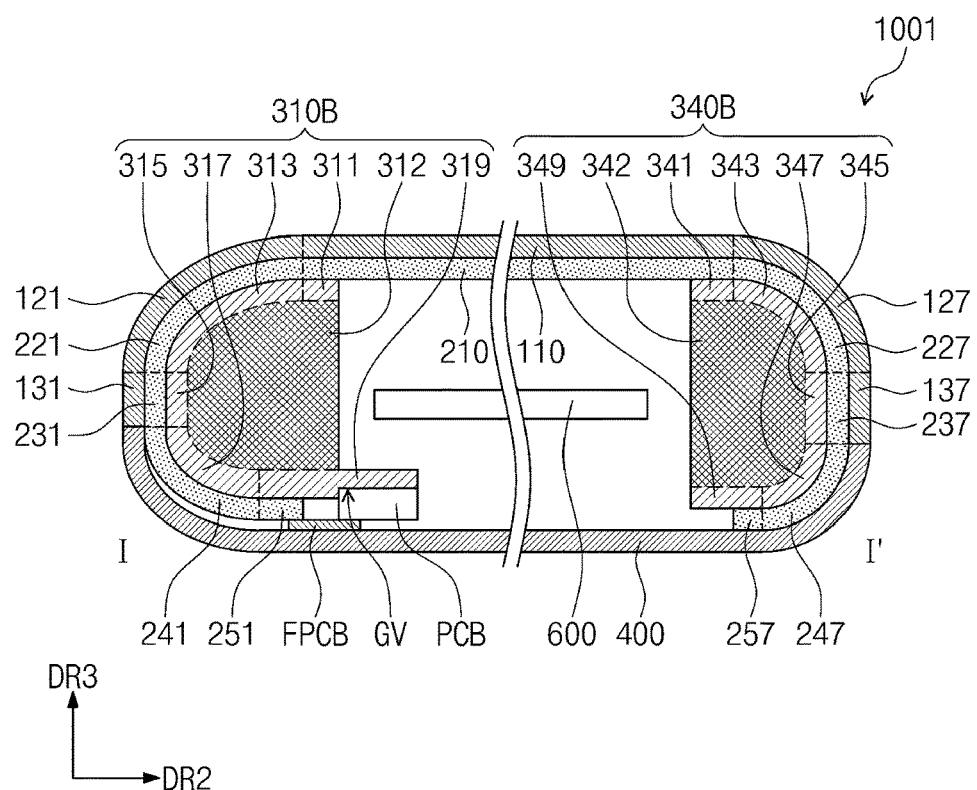
FIG. 14 is a cross-sectional view of another embodiment of a display apparatus taken along the line I-I' of FIG. 1 according to the invention.
Figure 15:
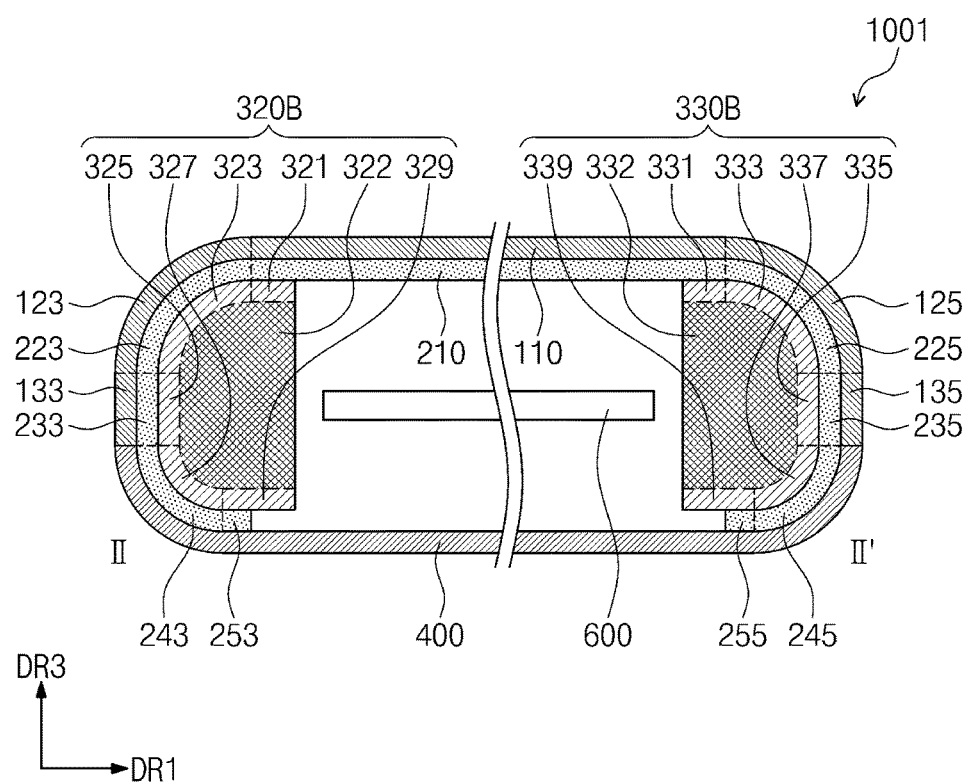
FIG. 15 is a cross-sectional view of the display apparatus of FIG. 14 taken along the line II-II' of FIG. 1 according to the invention.
Figure 16:
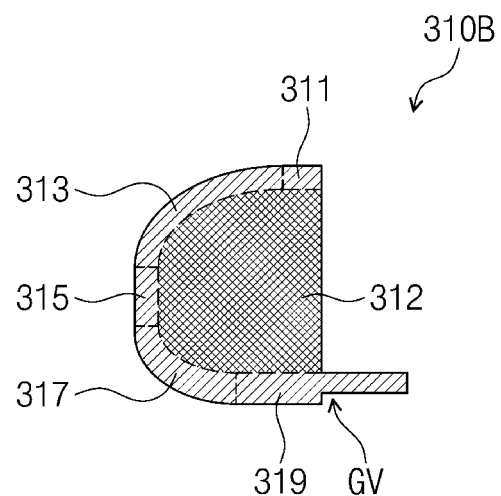
FIG. 16 is an enlarged cross-sectional view illustrating an embodiment of a first support member in the display apparatus of FIG. 14.
Figure 17:
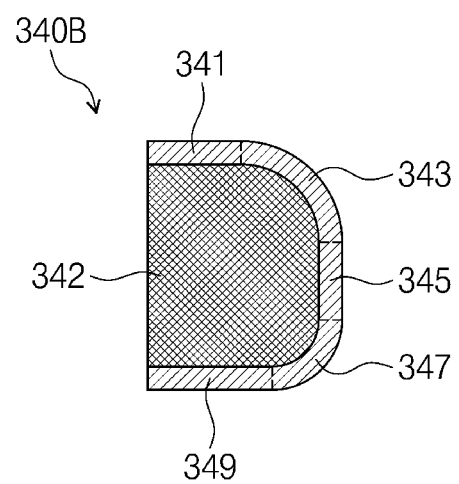
FIG. 17 is an enlarged cross-sectional view illustrating an embodiment of a fourth support member in the display apparatus of FIG. 14.

FIG. 14 is a cross-sectional view of another embodiment of a display apparatus taken along the line I-I' of FIG. 1 according to the invention, and FIG. 15 is a cross-sectional view of the display apparatus of FIG. 14 taken along the line II-II' of FIG. 1 according to the invention. FIG. 16 is an enlarged cross-sectional view illustrating an embodiment of a first support member in the display apparatus of FIG. 14, and FIG. 17 is an enlarged cross-sectional view illustrating an embodiment of a fourth support member in the display apparatus of FIG. 14.

A display apparatus 1001 of FIGS. 14 to 17 may include first to fourth support members 310B, 320B, 330B and 340B which are different from the first to fourth support members 310, 320, 330 and 340 of the display apparatus 1000 of FIGS. 1 to 4.

The first support member 310B according to embodiments may further include a first inner support portion 312. The first inner support portion 312 may be disposed in an inner space of the display apparatus 1001, which is formed by the first upper flat support portion 311, the first upper bent support portion 313, the first extending flat support portion 315, the first lower bent support portion 317, and the first lower flat support portion 319. An outer surface of the first inner support portion 312 may include a curved surface and may be in contact with inner surfaces of the first upper flat support portion 311, the first upper bent support portion 313, the first extending flat support portion 315, the first lower bent support portion 317 and the first lower flat support portion 319. The first inner support portion 312 may be a single unitary body which is connected to other portions of the first support member 310B. In an embodiment, the first upper flat support portion 311, the first upper bent support portion 313, the first extending flat support portion 315, the first lower bent support portion 317, and the first lower flat support portion 319 together with the first inner support portion 312 may form a single unitary body.

An inner side surface of the first inner support portion 312 may include a plane. The inner side surface of the first inner support portion 312 may be disposed to meet an inner side surface of the first upper flat support portion 311, such as to be coplanar therewith. In the present embodiment, along the third direction DR3, the first inner support portion 312 does not overlap with the receiving groove GV. However, embodiments of the invention are not limited to the arrangement of the first inner support portion 312 and the receiving groove GV. In another embodiment, the first inner support portion 312 and the receiving groove GV may partially overlap with each other.

In the present embodiment, the various portions 311, 312, 313, 315, 317 and 319 of the first support member 310B may include a same material as each other. However, embodiments of the invention are not limited to a same material for each of the various portions 311, 312, 313, 315, 317 and 319.

The fourth support member 340B according to embodiments may further include a fourth inner support portion 342. The fourth inner support portion 342 may be disposed in an inner space of the display apparatus 1001, which is formed by the fourth upper flat support portion 341, the fourth upper bent support portion 343, the fourth extending flat support portion 345, the fourth lower bent support portion 347, and the fourth lower flat support portion 349. An outer surface of the fourth inner support portion 342 may be in contact with inner surfaces of the fourth upper flat support portion 341, the fourth upper bent support portion 343, the fourth extending flat support portion 345, the fourth lower bent support portion 347 and the fourth lower flat support portion 349. The fourth inner support portion 342 may be a single unitary body connected to other portions of the fourth support member 340B. In an embodiment, the fourth upper flat support portion 341, the fourth upper bent support portion 343, the fourth extending flat support portion 345, the fourth lower bent support portion 347, and the fourth lower flat support portion 349 together with the fourth inner support portion 342 may form a single unitary body.

An inner side surface of the fourth inner support portion 342 may include a plane. The inner side surface of the fourth inner support portion 342 may be disposed to meet an inner side surface of the fourth upper flat support portion 341 and an inner side surface of the fourth lower flat support portion 349, such as to be coplanar therewith. The receiving groove GV may not be provided in the fourth support member 340B.

In the present embodiment, the portions 341, 342, 343, 345, 347 and 349 of the fourth support member 340B may include a same material as each other. However, embodiments of the invention are not limited to a same material for each of the portions 341, 342, 343, 345, 347 and 349.

In the present embodiment, the second support member 320B and the third support member 330B may have substantially the same shape as the fourth support member 340B.

According to the embodiments, each of the first to fourth support members 310B, 320B, 330B and 340B may further include the inner support portion 312, 322, 332 or 342, and thus strength of the first to fourth support members 310B, 320B, 330B and 340B may be improved or increased. As a result, impact resistance of the bent area of the display apparatus 1001 may be effectively improved.

Figure 18:
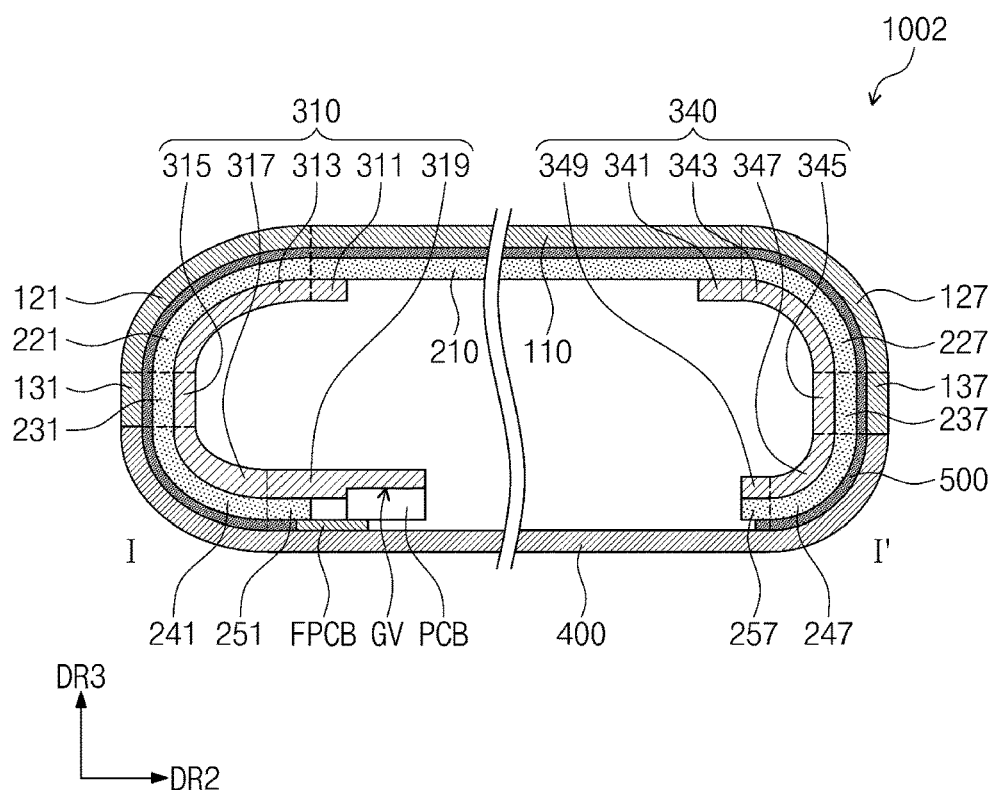
FIG. 18 is a cross-sectional view of still another embodiment of a display apparatus taken along the line I-I' of FIG. 1 according to the invention.
Figure 19:
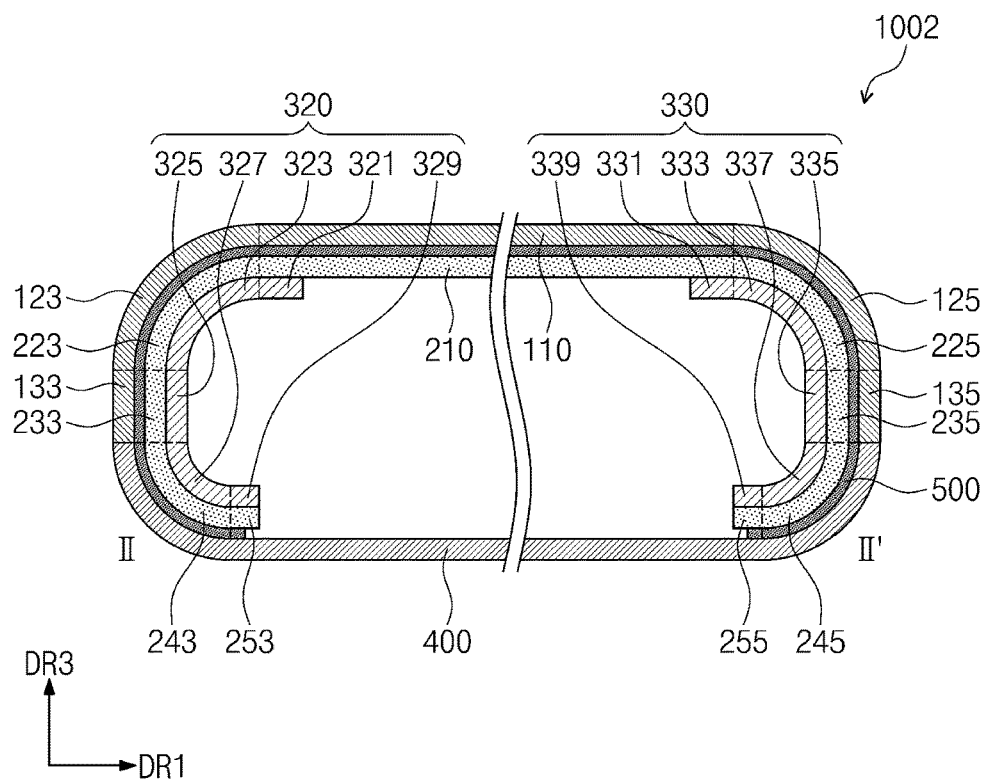
FIG. 19 is a cross-sectional view of the display apparatus of FIG. 18 taken along the line II-IF according to the invention.

FIG. 18 is a cross-sectional view of still another display apparatus taken along the line I-I' of FIG. 1 according to the invention, and FIG. 19 is a cross-sectional view of the display apparatus of FIG. 18 taken along the line II-II' of FIG. 1 according to the invention. In FIGS. 18 and 19, the electronic component 600 has been omitted for convenience of illustration.

A display apparatus 1002 of FIGS. 18 and 19 may further include an anti-reflection layer 500 as compared with the display apparatus 1000 of FIGS. 1 to 4, and other components of the display apparatus 1002 of FIGS. 18 and 19 may be substantially the same or similar as corresponding components of the display apparatus 1000 of FIGS. 1 to 4. Hereinafter, the anti-reflection layer 500 will be described in detail, and the descriptions to the other components will be omitted.

The anti-reflection layer 500 may be disposed between the display panel 200 and the window member 100. The anti-reflection layer 500 may be coupled to such as being adhered to the display panel 200 by an adhesive (not shown). The anti-reflection layer 500 may transmit light output from the display panel 200 to the outside and may reduce or effectively prevent external light from being reflected by components disposed under the anti-reflection layer 500 toward an inner area of the display apparatus 1002 to travel to the outside again.

The anti-reflection layer 500 may have a structure in which a linear polarizing plate and a λ/4 phase retardation layer are sequentially stacked. However, embodiments of the invention are not limited thereto. The anti-reflection layer 500 may be realized as at least one of various embodiments for reducing or effectively preventing reflection of external light.

The anti-reflection layer 500 may extend to overlap with the upper flat portion 210, the first to fourth upper bent portions 221, 223, 225 and 227, the first to fourth extending flat portions 231, 233, 235 and 237, the first to fourth lower bent portions 241, 243, 245 and 247 and the first to fourth lower flat portions 251, 253, 255 and 257 of the display panel 200.

Thus, in the display apparatus 1002 according to embodiments, the anti-reflection layer 500 may protect a maximum area (i.e., including the various flat and bent areas) of the display panel 200 from an external impact.

In the display apparatus 1002 according to embodiments of the invention, the display panel 200 may include the first to fourth upper bent portions 221, 223, 225 and 227 and the first to fourth lower bent portions 241, 243, 245 and 247, and thus a crack by bending may occur at the display panel 200 at these bent portion. However, in the display apparatus 1002 according to embodiments, the anti-reflection layer 500 may be adhered to an outer surface of the display panel 200 to form a neutral plane defined in the encapsulation layer TFE (see FIG. 7) at substantially an entire area of the display panel 200 including both the flat and bent portions thereof.

Figure 20:
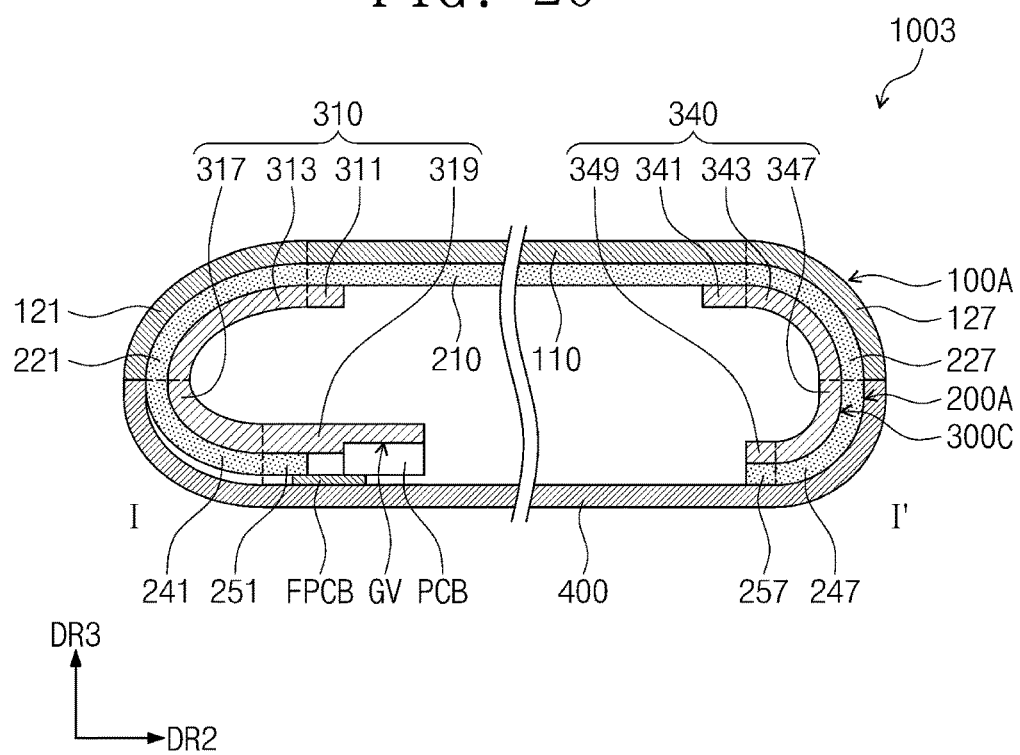
FIG. 20 is a cross-sectional view of yet another embodiment of a display apparatus taken along the line I-I' of FIG. 1 according to the invention.
Figure 21:
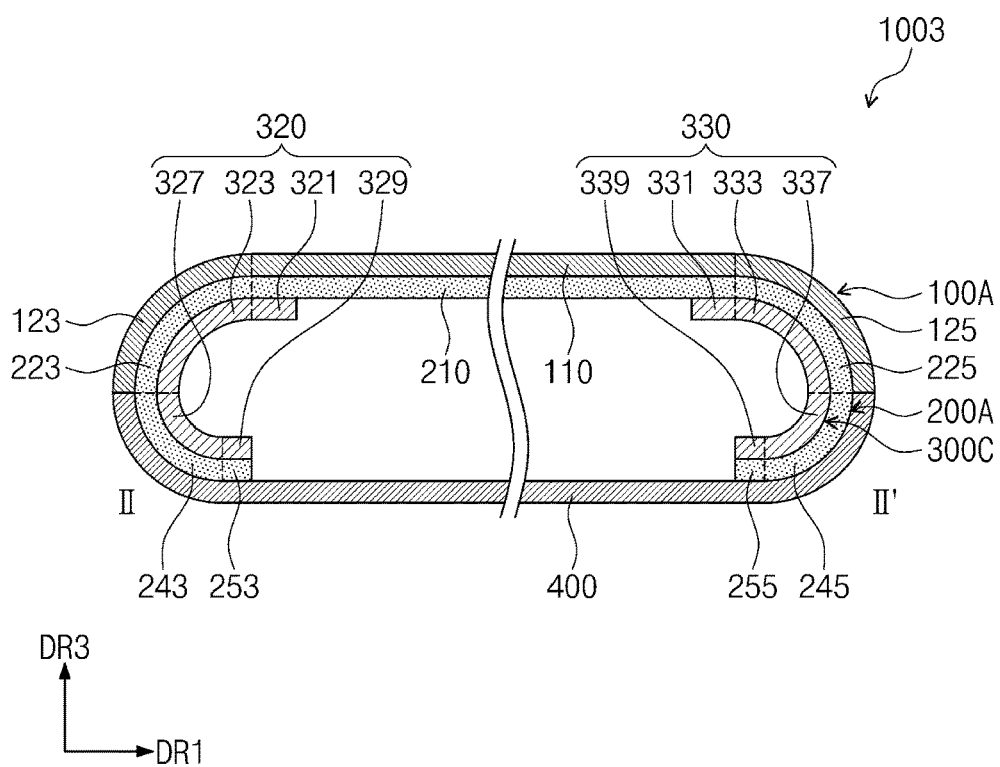
FIG. 21 is a cross-sectional view of the display apparatus of FIG. 20 taken along the line II-II' of FIG. 1 according to the invention.

FIG. 20 is a cross-sectional view of yet another embodiment of a display apparatus taken along the line I-I' of FIG. 1 according to the invention, and FIG. 21 is a cross-sectional view of the display apparatus of FIG. 20 taken along the line II-IF of FIG. 1 according to the invention.

A display apparatus 1003 of FIGS. 20 and 21 may include a window member 100A, a display panel 200A and a support member 300C of which shapes are different from those of the window member 100, the display panel 200 and the support member 300 of the display apparatus 1000 of FIGS. 1 to 4.

The window member 100A may have a structure obtained by omitting the first to fourth window extensions 131, 133, 135 and 137 from the window member 100 of FIGS. 1 to 4. The first to fourth window bent portions 121, 123, 125 and 127 of the window member 100A may be in contact with the back case 400.

The display panel 200A may have a structure obtained by omitting the first to fourth extending flat portions 231, 233, 235 and 237 from the display panel 200 of FIGS. 1 to 4. The first to fourth upper bent portions 221, 223, 225 and 227 of the display panel 200A may be connected directly to the first to fourth lower bent portions 241, 243, 245 and 247 of the display panel 200A, respectively.

The support member 300C may have a structure obtained by omitting the first to fourth extending flat support portions 315, 325, 335 and 345 from the support member 300 of FIGS. 1 to 4. The first to fourth upper bent support portions 313, 323, 333 and 343 of the support member 300C may be connected directly to the first to fourth lower bent support portions 317, 327, 337 and 347 of the support member 300C, respectively.

The display apparatus 1003 of FIGS. 20 and 21 may be slimmer in the third direction DR3 than the display apparatus 1000 described with reference to FIGS. 1 to 4.

Figure 22:
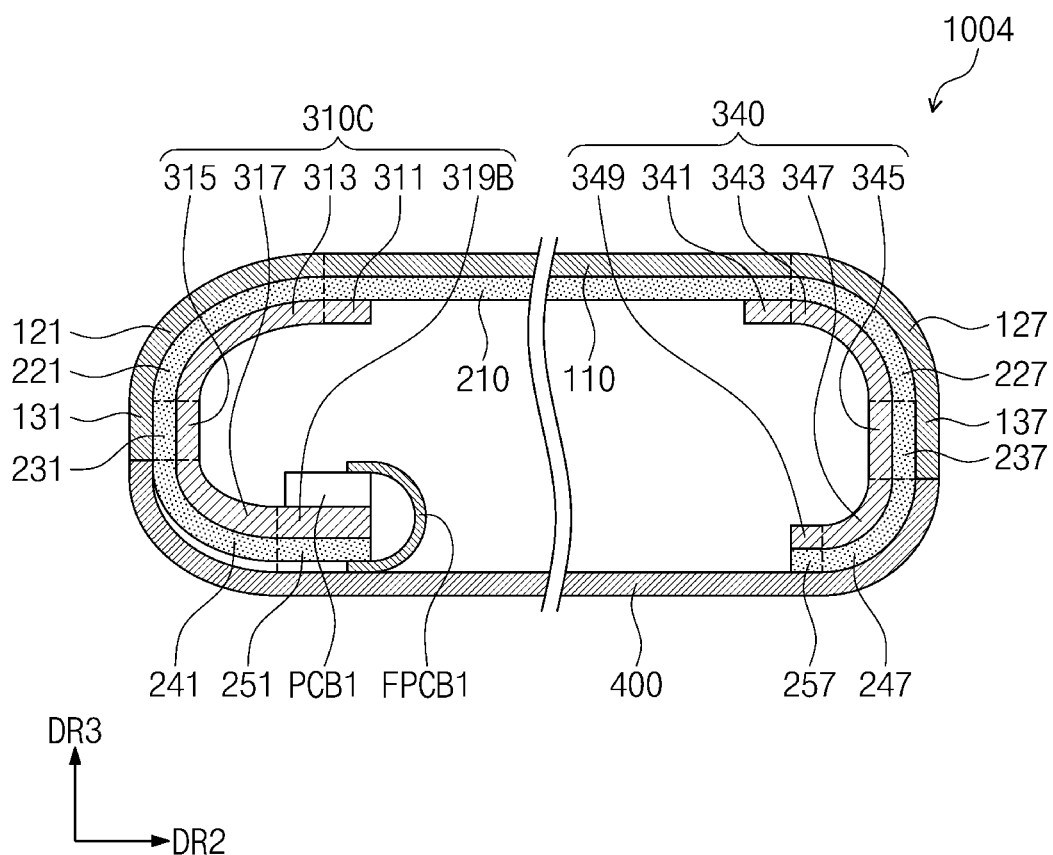
FIG. 22 is a cross-sectional view of yet another embodiment of a display apparatus taken along the line I-I' of FIG. 1 according to the invention.

FIG. 22 is a cross-sectional view of yet another embodiment of a display apparatus taken along the line I-I' of FIG. 1 according to the invention.

A first support member 310C, a flexible printed circuit board FPCB1 and a printed circuit board PCB1 of a display apparatus 1004 of FIG. 22 may be different from those of the display apparatus 1000 of FIGS. 1 to 4. Hereinafter, differences between the display apparatus 1004 of FIG. 22 and the display apparatus 1000 of FIGS. 1 to 4 will be mainly described.

The first support member 310C may include a first lower flat support portion 319B. The first lower flat support portion 319B may be shorter than the first lower flat support portion 319 of FIGS. 1 to 4, as referenced from the first lower bent support portion 317. In FIG. 22, the electronic component 600 has been omitted for convenience of illustration.

The flexible printed circuit board FPCB1 may be attached to the display panel 200 at an end portion of the first lower flat portion 251. The flexible printed circuit board FPCB1 may be bent from the first lower flat portion 251 of the display panel toward the first lower flat support portion 319B of the first support member 310C. The printed circuit board PCB1 may be in contact with the first lower flat support portion 319B at an inner area of the display apparatus 1004 and may be supported by the first lower flat support portion 319B. The first lower flat support portion 319B may be disposed between the printed circuit board PCB1 and the first lower flat portion 251 along the third direction DR3.

Figure 23:
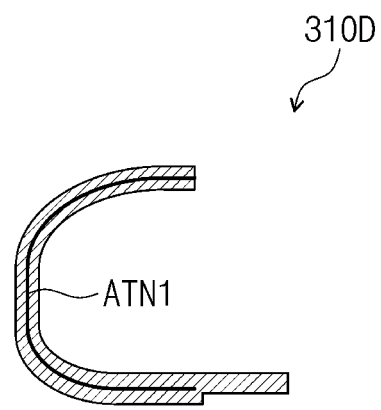
FIGS. 23 and 24 are enlarged cross-sectional views respectively illustrating other embodiments of a first support member and a fourth support member of a display apparatus, according to the invention.
Figure 24:
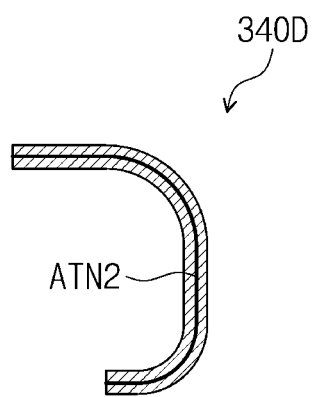

FIGS. 23 and 24 are enlarged cross-sectional views respectively illustrating other embodiments of a first support member and a fourth support member of a display apparatus, according to the invention.

A first support member 310D may include a first antenna pattern ATN1 disposed therein, and a fourth support member 340D may include a second antenna pattern ATN2 disposed therein. The first and fourth support members 310D and 340D may communicate with an external system through the first and second antenna patterns ATN1 and ATN2. The external system may be disposed external to the display apparatus without being limited thereto.

Second and third support members (not shown) may have substantially the same shape as the fourth support member 340D. It will be understood that the antenna pattern structure described above may be applied to any of the embodiments of the support member discussed above.

According to embodiments of the invention, the impact resistance of the bent areas of the display apparatus and a portable terminal having such display apparatus may be improved. In addition, since the display apparatus and the portable terminal having the display apparatus include the support members which structurally support the display panel at the non-display area thereof, a portion of the non-display area which is visible to the outside may be reduced or essentially removed.

While the invention has been described with reference to embodiments, it will be apparent to those skilled in the art that various changes and modifications may be made without departing from the spirits and scopes of the invention. Therefore, it should be understood that the above embodiments are not limiting, but illustrative. Thus, the scope of the invention are to be determined by the broadest permissible interpretation of the following claims and their equivalents, and shall not be restricted or limited by the foregoing description.

What is claimed is:

1. A display apparatus comprising:
    a window member through which an image is displayed to outside the display apparatus, the window member comprising: a window flat portion, and a window bent portion which extends and is bent outwardly from the window flat portion;
    a display panel comprising:
        an upper flat portion overlapping with the window flat portion, and an upper bent portion which extends and is bent outwardly from the upper flat portion to extend along the window bent portion, each of the upper flat portion and the upper bent portion respectively being a display area of the display panel; and
        a lower bent portion extending inwardly from the upper bent portion and bent toward a center of the upper flat portion, the lower bent portion being a non-display area of the display panel;
    a support member which disposes the display panel between the window member and the support member, the support member extending along the lower bent portion being the non-display portion of the display panel; and
    a back case which is coupled to the window member at the window bent portion thereof and forms a receiving space together with the window member, the display panel and the support member being received in the receiving space.

2. The display apparatus of claim 1, wherein in a top plan view,
    the upper flat portion of the display panel includes a chamfered corner thereof at which two sides of the upper flat portion meet each other, and
    the upper bent portion of the display panel extends from at least one side of the upper flat portion.

3. The display apparatus of claim 2, wherein
    the upper bent portion of the display panel comprises an upper chamfer bent portion which extends and is bent outwardly from the chamfered corner of the upper flat portion, and
    the window bent portion of the window member comprises an upper window chamfer bent portion which is bent outwardly from the window flat portion to be extended along the upper chamfer bent portion of the display panel.

4. The display apparatus of claim 1, wherein
    the window member further comprises a window extension which extends from the window bent portion and is flat,
    the display panel further comprises an extending flat portion which is disposed between the upper bent portion and the lower bent portion, overlaps with the window extension of the window member, and is flat, the extending flat portion being a portion of the display area of the display panel.

5. The display apparatus of claim 1, wherein
    the upper bent portion of the display panel comprises a first upper bent portion extending from a first side of the upper flat portion, and a second upper bent portion extending from a second side of the upper flat portion,
    the lower bent portion of the display panel comprises: a first lower bent portion extending and bent from the first upper bent portion, and a second lower bent portion extending and bent from the second upper bent portion,
    wherein the support member comprises:
        at the first side of the upper flat portion of the display panel, a first support member extended from the first side of the upper flat portion and along each of the upper flat portion, the first upper bent portion and the first lower bent portion of the display panel; and
        at the second side of the upper flat portion of the display panel, a second support member extended from the second side of the upper flat portion and along each of the upper flat portion, the second upper bent portion, and the second lower bent portion.

6. The display apparatus of claim 5, wherein the first support member and the second support member do not overlap with the center of the upper flat portion.

7. The display apparatus of claim 5, wherein
    the display panel further comprises:
        a first lower flat portion which is flat and extends inwardly from a distal end of the first lower bent portion toward the center of the upper flat portion; and
        a second lower flat portion which is flat and extends inwardly from a distal end of the second lower bent portion toward the center of the upper flat portion,
    the first support member comprises a first lower flat support portion which is flat, extends along the first lower flat portion of the display panel, and extends further than a distal end of the first lower flat portion, and
    the second support member further extends along the second lower flat portion of the display panel.

8. The display apparatus of claim 7, further comprising:
    a flexible printed circuit board connected to the first lower flat portion of the display panel; and
    a printed circuit board connected to the flexible printed circuit board,
    wherein the first lower flat support portion of the first support member comprises a receiving groove defined therein and in which the printed circuit board is disposed.

9. The display apparatus of claim 7, further comprising:
    a flexible printed circuit board connected at a first end thereof to the first lower flat portion of the display panel and bent toward an end of the first lower flat support portion of the first support member; and
    a printed circuit board connected to a second end of the flexible printed circuit board which is opposite to the first end thereof,
    wherein the printed circuit board connected to the second end of the flexible printed circuit board disposes the first lower flat support portion of the first support member between the printed circuit board and the first lower flat portion of the display panel.

10. The display apparatus of claim 1, wherein
in a top plan view, the upper flat portion of the display panel has a shape defining sides of the upper flat portion,
the upper bent portion comprises a first upper bent portion and a second upper bent portion respectively extending from a first side and a second side of the upper flat portion, and
the support member comprises:
a first support member extended from the first side of the upper flat portion and along each of the first upper bent portion and the lower bent portion of the display panel, and
a second support member extended from the second side of the upper flat portion and along each of the second upper bent portion and the lower bent portion of the display panel,
wherein in cross-section, the first support member has a different shape from that of the second support member.

11. The display apparatus of claim 10, wherein each of the first and second support members has a cross-section shape respectively extended along a length of the first and second sides of the upper flat portion of the display panel to define the first and second support members as a singular body.

12. The display apparatus of claim 11, wherein the singular body of the first support member is provided in plurality to define a plurality of first sub-support members arranged along the length of the first side of the upper flat portion to be spaced apart from each other.

13. The display apparatus of claim 10, wherein the first and second support members having different shapes from each other in the cross-section are connected to each other to form a singular body.

14. The display apparatus of claim 10, further comprising a space which is defined under the display panel and between the first and second support members and in which an electronic component is received.

15. The display apparatus of claim 1, further comprising an anti-reflection layer disposed between the window member and the display panel, the anti-reflection layer extending along each of the upper flat portion, the upper bent portion and the lower bent portion of the display panel.

16. The display apparatus of claim 1, wherein the support member includes an antenna pattern disposed therein.

17. A display apparatus comprising: a display panel comprising:
an upper flat portion, and an upper bent portion extending and bent outwardly from the upper flat portion, each of the upper flat portion and the upper bent portion respectively being a display area of the display panel; and
a lower bent portion extending inwardly from the upper bent portion and bent toward a center of the upper flat portion, the lower bent portion being a non-display area of the display panel; support member extending along inner surfaces of each of the upper flat portion, the upper bent portion and the lower bent portion of the display panel; and a back case which forms a receiving space, wherein the display panel and the support member are received in the receiving space formed by the back case.

18. A portable terminal comprising:
a window member through which an image is displayed to outside the display apparatus, the window member comprising a window flat portion, and a window bent portion which extends and is bent outwardly from the window flat portion;
a display panel comprising:
an upper flat portion overlapping with the window flat portion, and an upper bent portion which extends and is bent outwardly from the upper flat portion to extend along the window bent portion, each of the upper flat portion and the upper bent portion respectively being a display area of the display panel; and
a lower bent portion extending inwardly from the upper bent portion and bent toward a center of the upper flat portion, the lower bent portion being a non-display area of the display panel; and
a support member which disposes the display panel between the window member and the support member, the support member comprising:
an upper flat support portion extending along the upper flat portion of the display panel;
an upper bent support portion extending and bent outwardly from the upper flat support portion to extend along the upper bent portion of the display panel; and
a lower bent support portion extending and bent inwardly from the upper bent support portion to extend along the lower bent portion of the display panel.

19. The portable terminal of claim 18, wherein in cross-section, each of the upper flat support portion, the upper bent support portion and the lower bent support portion of the support member has a uniform thickness.

* * * * *